(12) United States Patent
Taniguchi et al.

(10) Patent No.: US 10,893,639 B2
(45) Date of Patent: Jan. 12, 2021

(54) COMPONENT MOUNTING USING FEEDBACK CORRECTION

(71) Applicant: Panasonic Intellectual Property Management Co., Ltd., Osaka (JP)

(72) Inventors: Masahiro Taniguchi, Fukuoka (JP); Masahiro Kihara, Fukuoka (JP); Satoshi Furuichi, Fukuoka (JP); Toshihiko Nagaya, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 447 days.

(21) Appl. No.: 15/860,735

(22) Filed: Jan. 3, 2018

(65) Prior Publication Data
US 2018/0199480 A1 Jul. 12, 2018

(30) Foreign Application Priority Data

Jan. 12, 2017 (JP) ................................. 2017-002994
Jan. 12, 2017 (JP) ................................. 2017-002995

(51) Int. Cl.
*H05K 3/30* (2006.01)
*H05K 13/08* (2006.01)

(52) U.S. Cl.
CPC ........... *H05K 13/08* (2013.01); *H05K 13/083* (2018.08); *H05K 13/0815* (2018.08); *Y10T 29/53178* (2015.01)

(58) Field of Classification Search
CPC .... H05K 13/08; H05K 13/083; H05K 3/0815; H05K 13/0408; G05B 19/402; Y10T 29/49131; Y10T 29/531317; Y10T 29/53191
USPC ................................. 29/832, 833, 739, 740
See application file for complete search history.

(56) References Cited

U.S. PATENT DOCUMENTS

| 6,216,341 | B1 * | 4/2001 | Nakahara | ........... | H05K 13/0815 |
| | | | | | 29/833 |
| 6,757,966 | B2 * | 7/2004 | Inoue | ................. | H05K 13/0465 |
| | | | | | 29/840 |
| 10,448,548 | B2 * | 10/2019 | Eguchi | ................. | G05B 19/402 |

FOREIGN PATENT DOCUMENTS

| JP | 2006-080197 A | 3/2006 |
| JP | 2008-205424 A | 9/2008 |
| JP | 2016-058603 A | 4/2016 |
| JP | 2018-082096 A | 5/2018 |

* cited by examiner

*Primary Examiner* — Donghai D Nguyen
(74) *Attorney, Agent, or Firm* — Pearne & Gordon LLP

(57) ABSTRACT

A method includes a component mounting step of mounting components on a board; a positional deviation amount acquisition step of acquiring a positional deviation amount of each of the components mounted on the board, from a corresponding normal position; and a correction value calculation step of calculating a feedback correction value for correcting a mounting operation in the component mounting step, based on the acquired positional deviation amount. In the correction value calculation step, the feedback correction value is calculated based on the positional deviation amount of each of the components mounted in each of a plurality of division areas on the board, for each of the plurality of division areas, and in the component mounting step, the mounting operation is corrected by using the feedback correction value of the plurality of division areas in which the components are mounted.

13 Claims, 14 Drawing Sheets

(Gx3+ Gx4) > (Gx1+ Gx2)
(Gy3+ Gy4) > (Gy1+ Gy2)

COMPONENT MOUNTING USING FEEDBACK CORRECTION

BACKGROUND

1. Technical Field

The present disclosure relates to a component mounting system and a component mounting method which mount a component on a board by using a feedback correction value calculated based on a positional deviation amount of the component mounted on the board, and a correction value calculation device which calculates the feedback correction value.

2. Description of the Related Art

A component mounter extracts a component supplied by a component supplying device by using a suction nozzle of a mounting head, and mounts the component on a board. The mounting head is moved in a horizontal direction by an XY beam consisting of X-axis beams and Y-axis beams. In the related art, in order to improve a mounting accuracy of mounting a component on a board, a mounting positional deviation of the component mounted on the board from a normal position is inspected by an inspection device, and a mounting operation performed by the component mounter is corrected by using a feedback correction value calculated based on the mounting positional deviation amount (for example, refer to Japanese Patent Unexamined Publication No. 2016-58603).

In a component mounting system of Japanese Patent Unexamined Publication No. 2016-58603, the mounting positional deviation amount is inspected for each component mounted on the board by the inspection device disposed on a downstream side of the component mounter, and the mounting operation performed by the component mounter is corrected by using the feedback correction value calculated for each component.

SUMMARY

According to the disclosure, there is provided a component mounting system including: a component mounter that mounts components on a board; a mounting controller that controls a mounting operation of mounting the components on the board, the mounting operation being performed by the component mounter; a positional deviation amount acquisition unit that acquires a positional deviation amount of each of the components mounted on the board by the component mounter, from a corresponding normal position; and a correction value calculator that calculates a feedback correction value for correcting the mounting operation performed by the component mounter, based on the positional deviation amount acquired by the positional deviation amount acquisition unit. The correction value calculator calculates the feedback correction value, based on the positional deviation amount of each of the components mounted in each of a plurality of division areas on the board, for each of the plurality of division areas, and the mounting controller corrects the mounting operation performed by the component mounter by using the feedback correction value of the plurality of division areas in which the components are mounted.

According to the disclosure, there is provided a component mounting method including: a component mounting step of mounting components on a board; a positional deviation amount acquisition step of acquiring a positional deviation amount of each of the components mounted on the board in the component mounting step, from a corresponding normal position; and a correction value calculation step of calculating a feedback correction value for correcting a mounting operation in the component mounting step, based on the positional deviation amount acquired in the positional deviation amount acquisition step. In the correction value calculation step, the feedback correction value is calculated based on the positional deviation amount of each of the components mounted in each of a plurality of division areas on the board, for each of the plurality of division areas, and in the component mounting step, the mounting operation is corrected by using the feedback correction value of the plurality of division areas in which the components are mounted.

According to the disclosure, there is provided a correction value calculation device including: a correction value calculator that calculates a feedback correction value for correcting a mounting operation performed by a component mounter, based on a positional deviation amount of each of components mounted in each of a plurality of division areas, for each of the plurality of division areas, based on the positional deviation amount of each of the components mounted on the board by the component mounter, from a corresponding normal position; and a management storage that stores the feedback correction value calculated by the correction value calculator.

According to the disclosure, the mounting positional deviation of the component due to the influence of changes in the device can be accurately corrected.

DETAILED DESCRIPTIONS

The problems in the related art will be briefly described prior to the description of embodiments.

In the related art including Japanese Patent Unexamined Publication No. 2016-58603, the mounting positional deviation is fed back for each component mounted on the board, but the main cause in which the mounting positional deviation of the component occurs is the various changes of constituent elements of the component mounter such as distortion of the XY beam. Thus, there is room for improvement in order to improve a mounting accuracy.

The disclosure provides a component mounting system and a component mounting method which can accurately correct a mounting positional deviation of a component due to the influence of changes in the device, and a correction value calculation device.

Figure 2:
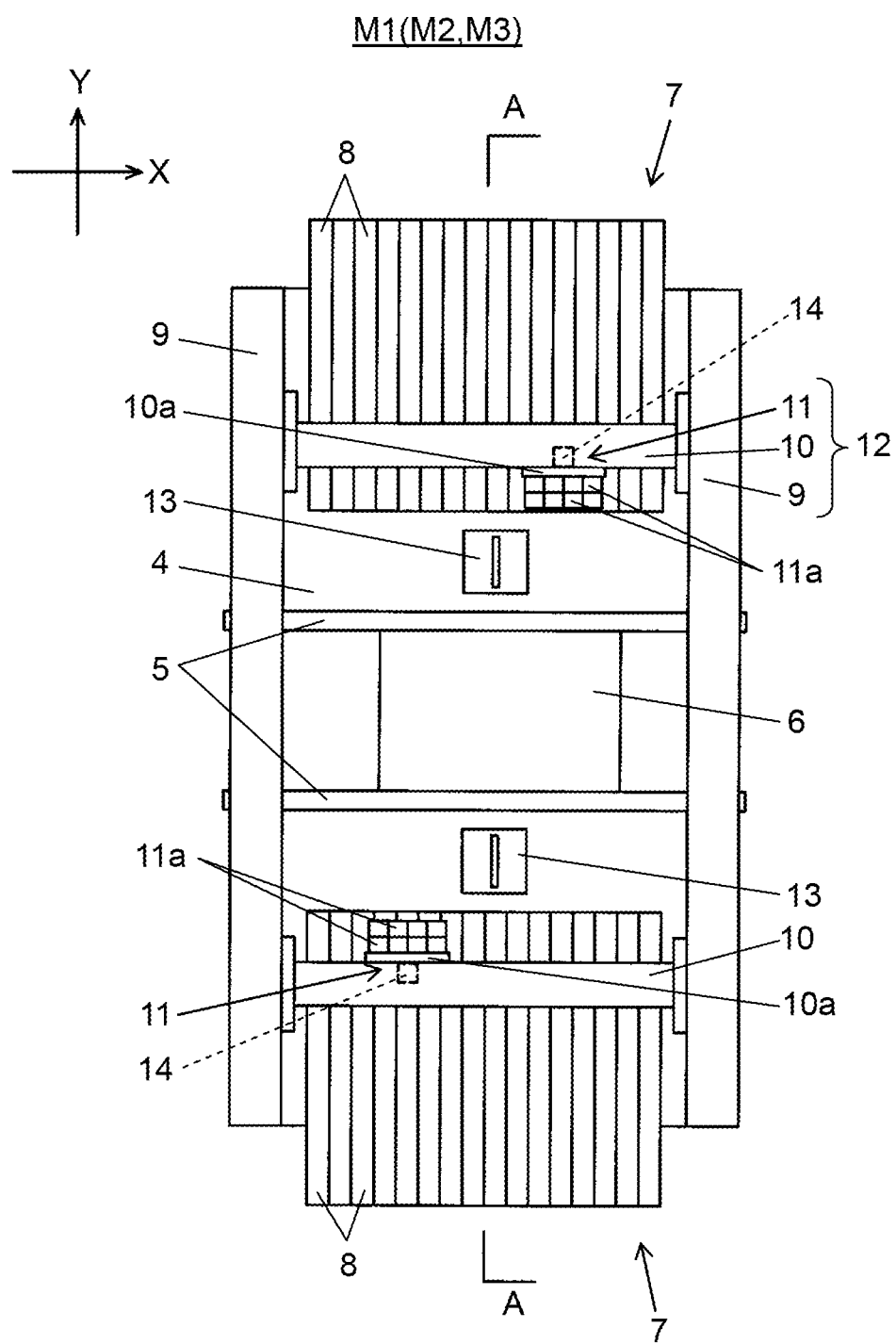
FIG. 2 is a plan view illustrating the configuration of a component mounter according to Exemplary Embodiment 1 of the disclosure.
Figure 3:
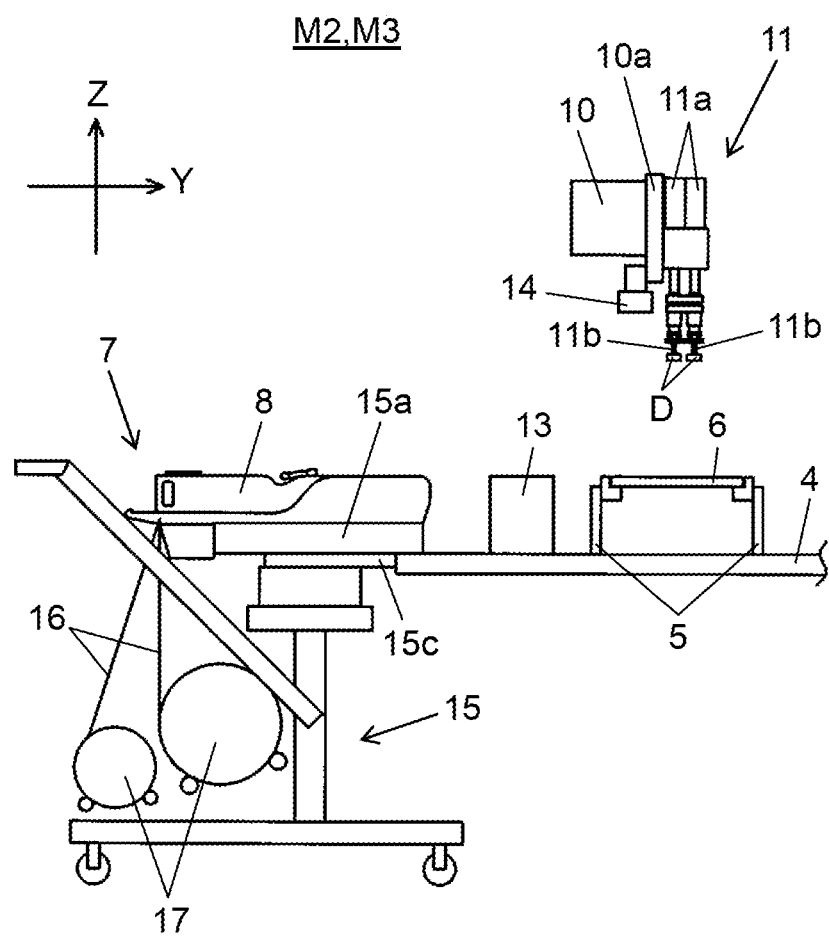
FIG. 3 is a diagram illustrating the component mounter according to Exemplary Embodiment 1 of the disclosure.
Figure 4:
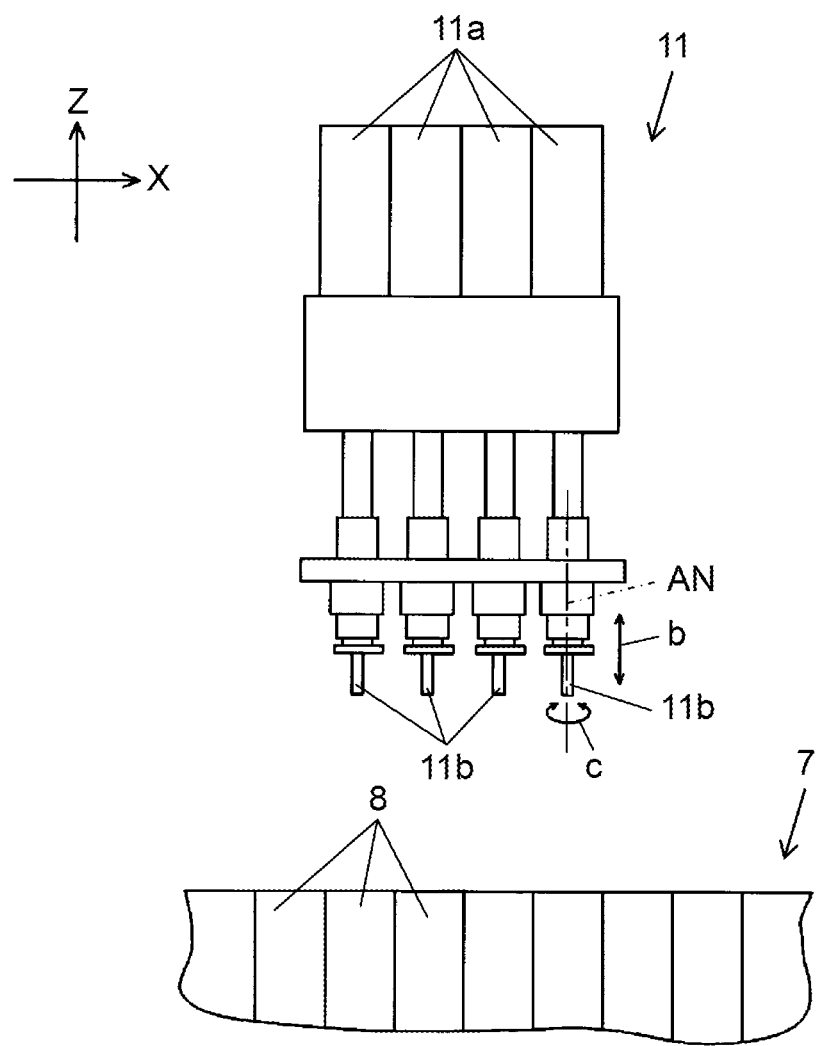
FIG. 4 is a configuration diagram illustrating a mounting head of the component mounter and a component supply unit according to Exemplary Embodiment 1 of the disclosure.

Hereinafter, Exemplary Embodiment 1 of the disclosure will be described in detail with reference to the drawings. Configurations, shapes, and the like described below are merely examples, and can be appropriately changed according to the specifications of the component mounting system, the component mounter, and an inspection device. In all the drawings, the same reference numeral is given to the corresponding elements, and the description thereof will not be repeated. In FIG. 2 and some of the drawings described below, as two axis directions which are orthogonal to each other in a horizontal plane, an X direction of a board transportation direction (left-right direction in FIG. 2), and a Y direction orthogonal to the board transportation direction (up-down direction in FIG. 2) are illustrated. In FIG. 3 and some of the drawings, a Z direction (up-down direction in FIG. 3) is illustrated as a height direction orthogonal to the horizontal plane. The Z direction is an up-down direction of when the component mounter is provided on the horizontal plane. In FIG. 4 and some of the drawings, a θ direction that is a rotation direction in which an axis of the Z direction (Z axis) is set as a rotational axis is illustrated.

Figure 1:
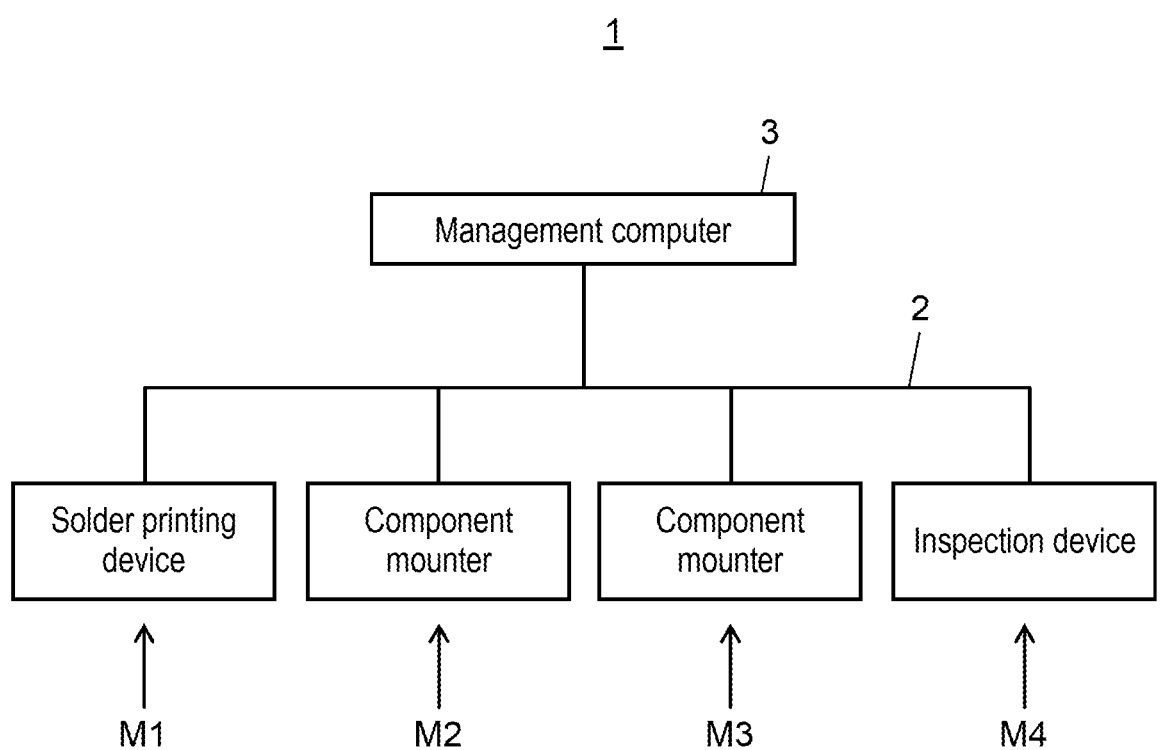
FIG. 1 is a configuration diagram illustrating a component mounting system according to Exemplary Embodiment 1 of the disclosure.

The configuration of component mounting system 1 will be described with reference to FIG. 1. Component mounting system 1 has a function of manufacturing a mounting board by mounting components on a board, and includes solder printing device M1, component mounters M2 and M3, and inspection device M4. The devices are connected to management computer 3 via communication network 2. The number of component mounters M2 and M3 of component mounting system 1 is not limited to two, and may be one or three or more.

Solder printing device M1 applies solder paste for component bonding, to a mounting target board by screen printing. Component mounters M2 and M3 perform a component mounting operation in which a component extracted from a component supply unit is moved to be mounted on the board to which the solder paste for component bonding is applied, performed by component mounter 12 (refer to FIG. 2). Inspection device M4 inspects a mounting state of the component on the board on which the component is mounted by component mounters M2 and M3 to detect a positional deviation state or the like of the component from a normal position. Management computer 3 has a line management function, and a function of calculating feedback correction value Vc for correcting a mounting operation to be fed back to component mounters M2 and M3, based on inspection information including a positional deviation amount of the component, acquired by inspection device M4.

Next, the configuration of component mounters M2 and M3 will be described with reference to FIGS. 2 and 3. FIG. 3 illustrates a part of a cross section taken along line A-A of FIG. 2. Component mounters M2 and M3 have a function of performing the mounting operation in which the component supplied from the component supply unit is mounted on the board. In FIG. 2, board transport mechanism 5 is provided in the center of base 4 to be disposed in the X direction. Board transport mechanism 5 carries board 6 transported from the upstream side, into a mounting working position to position and hold board 6. In addition, board transport mechanism 5 carries board 6 for which the component mounting work is completed, out to the downstream side.

Component supply units 7 are respectively disposed on both sides (a front side and a rear side) of board transport mechanism 5. A plurality of tape feeders 8 are installed in parallel in each of component supply units 7. Tape feeder 8 pitch-feeds a carrier tape with a pocket in which the component is accommodated, in a direction toward board transport mechanism 5 from the outer side of component supply unit 7 (a tape feeding direction), to supply the component to a component suction position at which a mounting head of component mounter 12 sucks the component.

Y-axis beams 9 including a linear driving mechanism are provided at both end portions of the upper surface of base 4 in the X direction to be disposed along the Y direction. Two (front side and rear side) X-axis beams 10 similarly including the linear driving mechanism are connected to Y-axis beams 9 so as to be movable in the Y direction. X-axis beams 10 are disposed along the X direction. Mounting head 11 is installed on each of the two X-axis beams 10 so as to be movable in the X direction. Mounting head 11 includes a plurality of suction units 11a which are vertically movable while sucking and holding the component. Suction nozzle 11*b* (refer to FIG. 3) which sucks and holds the component is installed at a lower end portion of each of suction units 11*a*.

In FIG. 2, mounting head 11 is moved in the X direction and the Y direction by driving Y-axis beams 9 and X-axis beams 10. In this manner, two mounting heads 11 extract the component from the component suction position of tape feeder 8 disposed on the corresponding component supply unit 7 by causing suction nozzle 11*b* to suck the component, and install the component on a mounting point of board 6 that is positioned by board transport mechanism 5. That is, Y-axis beams 9, X-axis beams 10, and mounting heads 11 configure component mounters 12 which mount the component on board 6. In this manner, component mounters M2 and M3 include two component mounters 12 that are respectively provided on the front side and the rear side.

Component recognition camera 13 is provided between component supply unit 7 and board transport mechanism 5. Component recognition camera 13 recognizes a holding state of the component by imaging the component in a state where the component is held by mounting head 11 when mounting head 11, which has extracted the component from component supply unit 7, is moved above component recognition camera 13. Board recognition camera 14 is attached to plate 10*a* to which mounting head 11 is attached. Board recognition camera 14 is moved integrally with mounting head 11.

Board recognition camera 14 is moved above board 6, which is positioned by board transport mechanism 5, by the movement of mounting head 11, and recognizes the position of board 6 by imaging a board mark (not illustrated) provided on board 6. In addition, board recognition camera 14 is moved above the component suction position of tape feeder 8, and recognizes the state of the carrier tape in the vicinity of the component suction position. In the component mounting operation performed by mounting head 11 with respect to board 6, the mounting position is corrected by using the recognition result of the component by component recognition camera 13, and the recognition result of the board position by board recognition camera 14.

As illustrated in FIG. 3, carriage 15 in a state where a plurality of tape feeders 8 are installed on feeder base 15*a* in advance is set to component supply unit 7. In component supply unit 7, the position of carriage 15 is fixed with respect to a fixed base (not illustrated) provided on base 4 by clamping feeder base 15*a* with a clamp mechanism 15*b*. Carriage 15 holds tape reel 17 that accommodates carrier tape 16 which holds component D, in a wound state. Carrier tape 16 reeled out from tape reel 17 is pitch-fed, by tape feeder 8, to the component suction position where the component is sucked by suction nozzle 11*b*.

The configuration of mounting head 11 will be described with reference to FIG. 4. Mounting head 11 includes a plurality of suction units 11*a*, and each suction unit 11*a* includes a driving mechanism. By the driving mechanism being driven, suction nozzle 11*b* installed at a lower end portion of each suction unit 11*a* is vertically moved (arrow b), and suction nozzle 11*b* is rotated in the θ direction (arrow c) with a nozzle axis AN as a rotational axis.

That is, mounting head 11 is a component suction unit that sucks component D; rotates component D by a predetermined angle in the rotation direction (the θ direction) parallel with the mounting surface of board 6; and mounts component D. Component mounter 12 is a component mounting section that includes the component suction unit; includes the plurality of suction nozzles 11*b*; rotates component D in the rotation direction parallel with the mounting surface of board 6 by using suction nozzle 11*b*; and mounts component D on board 6.

The configuration of a control system of component mounting system 1 will be described with reference to FIG. 5. Management computer 3, component mounters M2 and M3, and inspection device M4 are connected to each other via communication network 2. Component mounters M2 and M3 include mounting controller 20, mounting storage 21, component mounter 12, display unit 22, input unit 23, recognition processing unit 24, and communicator 25. Mounting data 21*a* and correction value data 21*b* are stored in mounting storage 21 in addition to a mounting program for performing the component mounting work.

Mounting data 21*a* includes information, which is data referred to when component D is mounted on board 6, such as coordinates of the mounting position (normal position) of component D on board 6, a rotation angle of component D of when component D is mounted, the kind of component D to be mounted, and the like. Correction value data 21*b* includes feedback correction value Vc transmitted from management computer 3 which will be described below.

Mounting controller 20 is an arithmetic device such as a CPU, and controls the mounting operation of mounting component D on board 6, performed by component mounter 12 by controlling each unit based on the program or the data stored in mounting storage 21. Recognition processing unit 24 performs a process of recognizing the imaging result by board recognition camera 14 to detect the position of board 6. In addition, recognition processing unit 24 performs a process of recognizing the imaging result by component recognition camera 13 to detect the position of component D in a state of being held by mounting head 11.

Mounting controller 20 corrects the mounting operation performed by component mounter 12 based on mounting data 21*a*, correction value data 21*b*, the position of board 6, the position of component D held by component mounter 12, and feedback correction value Vc, and mounts component D on board 6. In addition, mounting controller 20 rotates component D held by mounting head 11 (component suction unit) by a rotation angle designated by mounting data 21*a*, and mounts component D on board 6. Mounting controller 20 is a mounting control section that controls the mounting operation of mounting component D on board 6, performed by component mounter 12 (the component mounting section).

Input unit 23 is an input device such as a keyboard, a touch panel, a mouse, or the like, and is used when a manipulation command or data is input. Display unit 22 is a display device such as a liquid crystal panel, and displays various information such as various screens, for example, a manipulation screen for manipulation by input unit 23. Communicator 25 is a communication interface, and transmits and receives signals and data to and from other component mounters M2 and M3, management computer 3, and inspection device M4 via communication network 2.

Figure 5:
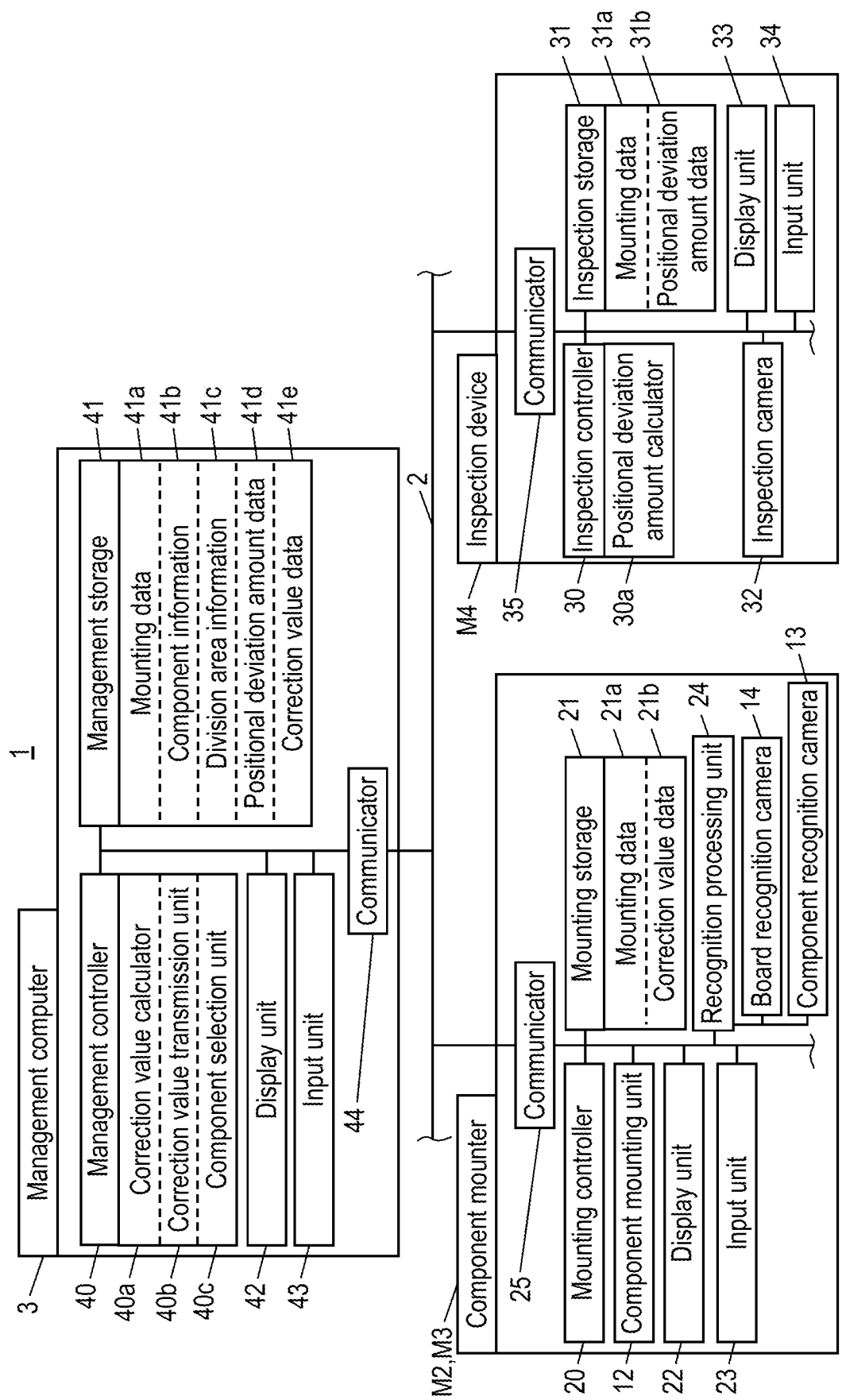
FIG. 5 is a block diagram illustrating the configuration of a control system of a component mounting system according to Exemplary Embodiment 1 of the disclosure.

In FIG. 5, inspection device M4 includes inspection controller 30, inspection storage 31, inspection camera 32, display unit 33, input unit 34, and communicator 35. Inspection controller 30 is an arithmetic device such as a CPU, and includes positional deviation amount calculator 30*a* as an internal processing function. Inspection storage 31 is a storage device, and stores mounting data 31*a*, positional deviation amount data 31*b*, and the like. Mounting data 31*a* includes information, which is data referred to when component D is mounted on board 6, such as coordinates of the mounting position (normal position) of component D on board 6, a rotation angle of component D of when component D is mounted, the kind of component D to be mounted, and the like.

Input unit 34 is an input device such as a keyboard, a touch panel, a mouse, or the like, and is used when a manipulation command or data is input. Display unit 33 is a display device such as a liquid crystal panel, and displays various information such as various screens, for example, a manipulation screen for manipulation by input unit 34. Communicator 35 is a communication interface, and transmits and receives signals and data to and from component mounters M2 and M3, and management computer 3 via communication network 2.

Inspection camera 32 images component D mounted on board 6 from above. Positional deviation amount calculator 30a performs a positional deviation amount calculation process of calculating positional deviation amounts $\Delta X$, $\Delta Y$, and $\Delta \theta$ (refer to FIG. 6) of component D mounted on board 6 from normal position N based on the image imaged by inspection camera 32. Calculated positional deviation amounts $\Delta X$, $\Delta Y$, and $\Delta \theta$ are stored in inspection storage 31 as positional deviation amount data 31b, and are transmitted to management computer 3 via communicator 35.

In this manner, inspection device M4 is a positional deviation amount acquisition unit (a positional deviation amount acquisition section) which includes inspection camera 32 (a capturer) that images component D, and positional deviation amount calculator 30a that calculates positional deviation amounts $\Delta X$, $\Delta Y$, and $\Delta \theta$ of component D from normal position N based on the image imaged by inspection camera 32; and which acquires positional deviation amounts $\Delta X$, $\Delta Y$, and $\Delta \theta$ of component D, which is mounted on board 6 by component mounter 12 (the component mounting section), from normal position N.

Figure 6:
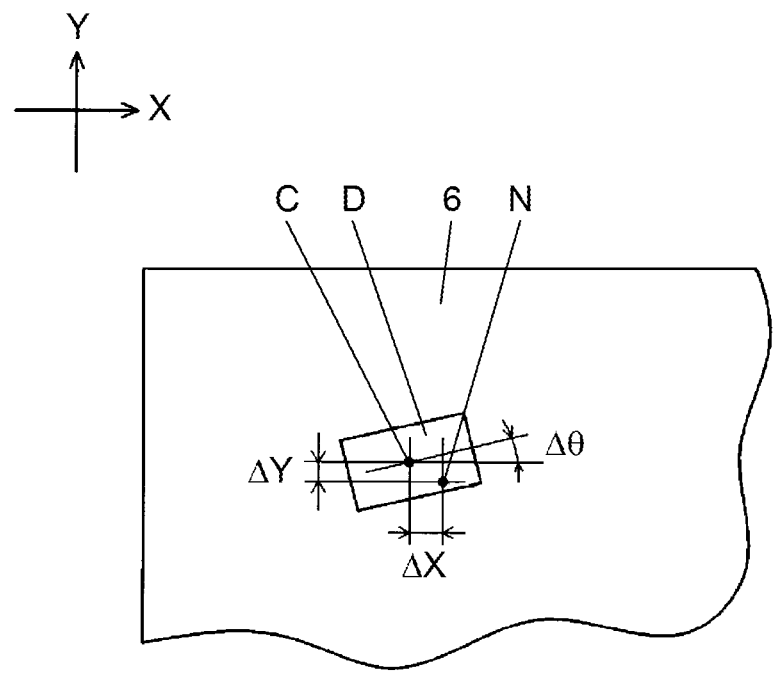
FIG. 6 is a diagram illustrating positional deviation amounts of a component calculated by an inspection device according to Exemplary Embodiment 1 of the disclosure.

An example of positional deviation amounts $\Delta X$, $\Delta Y$, and $\Delta \theta$ of component D mounted on board 6 from normal position N, which are included in positional deviation amount data 31b will be described with reference to FIG. 6. In the mounting operation performed by component mounter 12, component D extracted by suction nozzle 11b of mounting head 11 from tape feeder 8 of component supply unit 7 is moved to normal position N as a target, which is a mounting position set on board 6 to be mounted. In this case, component center C of component D may not correctly coincide with normal position N, and may be in a state in which component center C of component D is deviated by positional deviation amount $\Delta X$ in the X direction, positional deviation amount $\Delta Y$ in the Y direction, and positional deviation amount $\Delta \theta$ in the $\theta$ direction (the rotation direction parallel with the mounting surface).

Positional deviation amounts $\Delta X$, $\Delta Y$, and $\Delta \theta$ are acquired by positional deviation amount calculator 30a performing the positional deviation amount calculation process on the imaging result of component D mounted on board 6 by inspection camera 32. Positional deviation amounts $\Delta X$, $\Delta Y$, and $\Delta \theta$ are acquired for each of a plurality of components D mounted on one board 6, and are sorted as positional deviation amount data 31b.

In FIG. 5, management computer 3 includes management controller 40, management storage 41, display unit 42, input unit 43, and communicator 44. Input unit 43 is an input device such as a keyboard, a touch panel, a mouse, or the like, and is used when a manipulation command or data is input. Display unit 42 is a display device such as a liquid crystal panel, and displays various information such as various screens, for example, a manipulation screen for manipulation by input unit 43. Communicator 44 is a communication interface, and transmits and receives signals and data to and from component mounters M2 and M3, and inspection device M4 via communication network 2.

Management controller 40 is an arithmetic device such as a CPU, and includes correction value calculator 40a, correction value transmission unit 40b, and component selection unit 40c as an internal processing function. Management storage 41 is a storage device, and stores mounting data 41a, component information 41b, division area information 41c, positional deviation amount data 41d, and correction value data 41e.

Mounting data 41a includes information, which is data referred to when component D is mounted on board 6, such as coordinates of the mounting position (normal position) of component D on board 6, a rotation angle of component D of when component D is mounted, the kind of component D to be mounted, and the like. In component information 41b, information such as the shape and size of component D to be mounted on board 6, and gaps Gx and Gy (refer to FIGS. 8A and 8B) between component D to be accommodated, and pocket 16b of carrier tape 16 in which component D is to be accommodated, is stored by being associated with the kind of component D.

Figure 7:
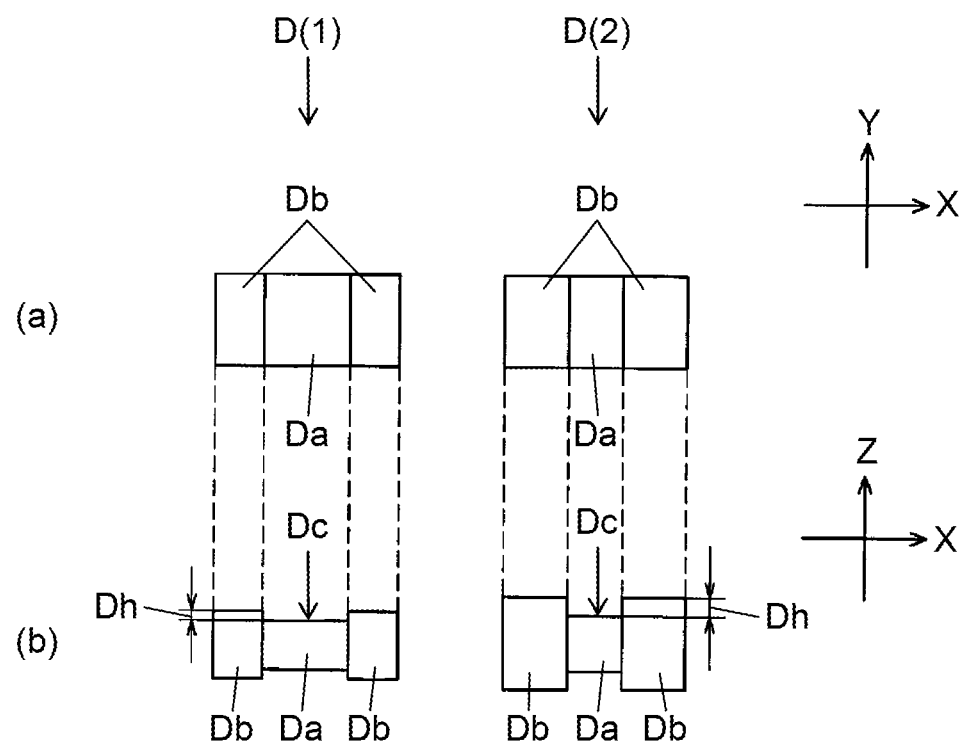
FIG. 7 is a diagram illustrating examples of a shape of a component to be mounted on a board by the component mounter according to Exemplary Embodiment 1 of the disclosure.

The shape of component D included in component information 41b will be described with reference to FIG. 7. Plan views of two kinds of component D(1) and component D(2) are illustrated in (a) of FIG. 7, and side views thereof are illustrated in (b) of FIG. 7. Component D(1) and component D(2) are a two-terminal device which has electrodes Db at both ends of main body Da in the X direction, such as a resistor or a capacitor. Component D(1) and component D(2) have the same size in the X direction, and the Y direction in plan view, but the gap between electrodes Db of component D(1) is larger than the gap between electrodes Db of component D(2). Therefore, suction surface Dc (XY surface of main body Da) with which the lower end of suction nozzle 11b comes into contact is larger in component D(1) than in component D(2), and an allowable range in which component D is normally sucked with respect to the suction positional deviation even when the positional deviation between suction nozzle 11b and component D occurs during the component suction is wider in component D(1) than in component D(2).

In addition, step Dh between suction surface Dc and the upper surface of electrodes Db is larger in component D(2) than in component D(1). Therefore, the inclination of the suction posture (the inclination of the component with respect to a horizontal plane) due to the suction deviation when suction nozzle 11b sucks component D at the boundary between main body Da and electrode Db is greater in component D(2) than in component D(1). For these reasons, although component D(2) has the same size as component D(1), variation (positional deviation amounts $\Delta X$, $\Delta Y$, and $\Delta \theta$) of the mounting position due to the suction variation is greater in component D(2) than in component D(1).

Figure 8A:
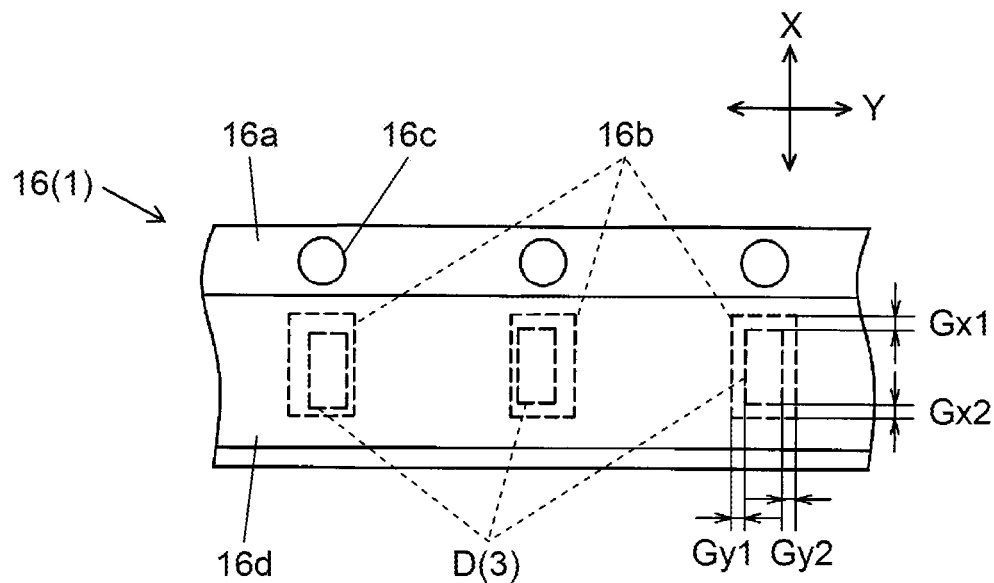
FIG. 8A is a diagram illustrating examples of a gap between a component and a pocket of a carrier tape used in the component mounter according to Exemplary Embodiment 1 of the disclosure.

Gaps Gx and Gy between component D to be accommodated, and pocket 16b of carrier tape 16, which are included in component information 41b will be described with reference to FIGS. 8A and 8B. In FIG. 8A, in base tape 16a of carrier tape 16(1), pockets 16b having a recessed shape in which component D(3) is accommodated, and feed holes 16c, with which sprockets (not illustrated) of tape feeder 8 that pitch-feeds carrier tape 16(1) are engaged, are respectively formed at even intervals. Cover tape 16d is attached to the upper surface of pocket 16b in which component D(3) is accommodated.

Gaps Gx1 and Gx2 and gaps Gy1 and Gy2 are respectively generated in the X direction and the Y direction between component D(3) accommodated in pocket 16b and inner walls of pocket 16b. Due to gaps G, component D(3) is irregularly moved in pocket 16b during pitch-feeding, and the suction position of when suction nozzle 11b sucks component D(3) varies. Therefore, the mounting position of when component D(3) is mounted on board 6 varies.

Figure 8B:
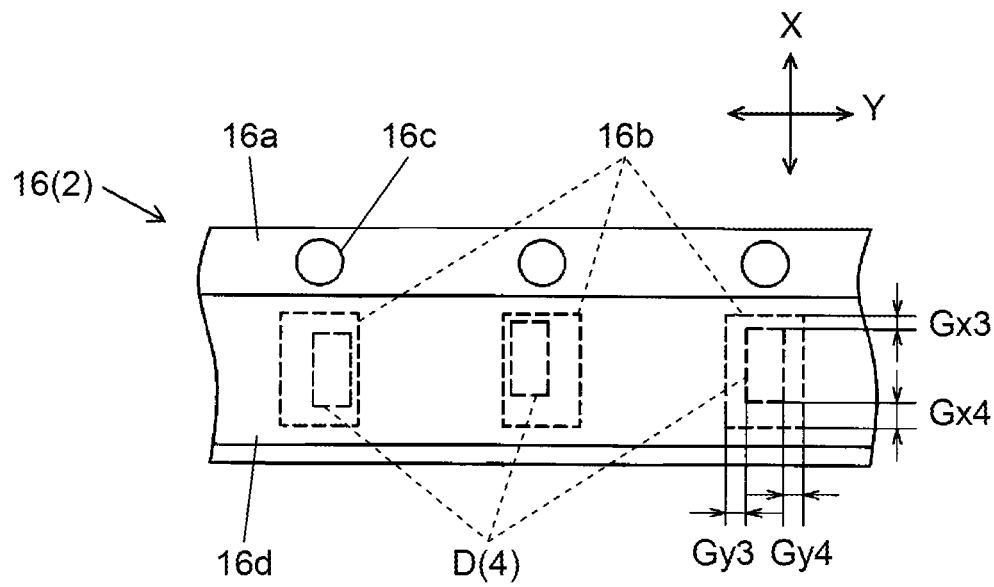
FIG. 8B is a diagram illustrating examples of a gap between a component and a pocket of a carrier tape used in the component mounter according to Exemplary Embodiment 1 of the disclosure.

In FIG. 8B, component D(4) having the same size as component D(3) is accommodated in pocket 16b of carrier tape 16(2). Gaps Gx3 and Gx4 and gaps Gy3 and Gy4 are respectively generated in the X direction and the Y direction between component D(4) and inner walls of pocket 16b. Pocket 16b of carrier tape 16(2) is larger than pocket 16b of carrier tape 16(1), gaps G (Gx3+Gx4, Gy3+Gy4) generated in carrier tape 16(2) are larger than gaps G (Gx1+Gx2, Gy1+Gy2) generated in carrier tape 16(1). Therefore, although component D(4) has the same size as component D(3), the variation of mounting position of when component D(4) is mounted on board 6 is greater than that of when component D(3) is mounted.

In FIG. 5, division area information 41c includes information on division area R that is a target range of when feedback correction value Vc (described below) is calculated. A plurality of division areas R are set on board 6.

Figure 9:
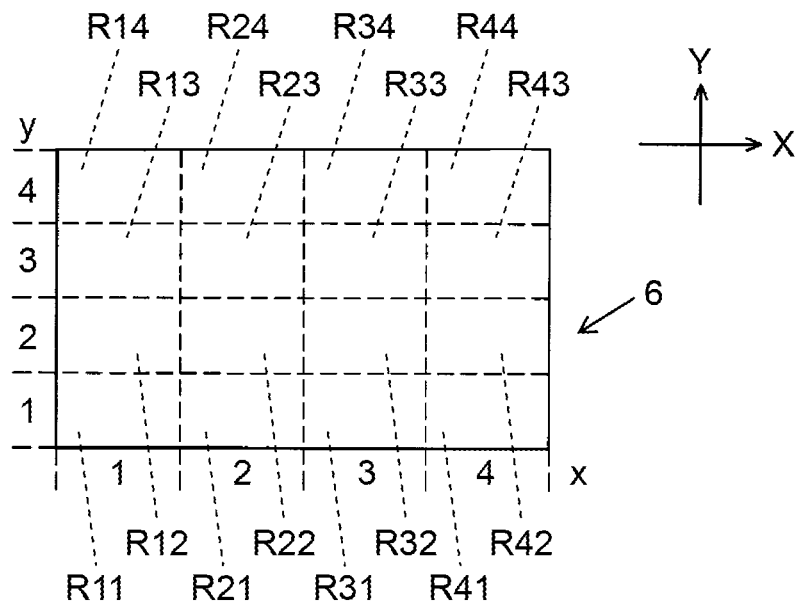
FIG. 9 is a diagram illustrating an example of division areas set in the component mounting system according to Exemplary Embodiment 1 of the disclosure.

An example of division areas R provided on board 6 will be described with reference to FIG. 9. In the example, rectangular board 6 is divided into four equal portions in the X direction and is divided into four equal portions in the Y direction, so that 16 division areas R11 to R44 are set in total. Division area R is set for each kind of the board in consideration of the size of board 6, a mounting accuracy, and the like, and information on division area R is stored in division area information 41c. Division area R may be set to correspond to the mounting working position of board transport mechanism 5 in the same way regardless of the kind of the board.

In FIG. 5, positional deviation amount data 31b including positional deviation amounts ΔX, ΔY, and Δθ which are continuously acquired by inspection device M4 during the manufacturing of the mounting board, is sequentially transmitted from inspection device M4 and is stored in the positional deviation amount data 41d. That is, management storage 41 that stores the positional deviation amount data 41d is a positional deviation amount storage that continuously stores positional deviation amounts ΔX, ΔY, and Δθ during the manufacturing.

Correction value calculator 40a calculates feedback correction value Vc for correcting the mounting operation performed by component mounter 12 (the component mounting section), based on positional deviation amount ΔX in the X direction and positional deviation amount ΔY in the Y direction (hereinafter, simply referred to as "positional deviation amounts ΔX and ΔY"), which are acquired by inspection device M4 (the positional deviation amount acquisition section) and are stored in the positional deviation amount data 41d, of component D mounted on board 6 from normal position N. Correction value calculator 40a calculates feedback correction value Vc for each of the plurality of division areas R on board 6, based on positional deviation amounts ΔX and ΔY of components D mounted in division area R. The meaning of calculating feedback correction value Vc for each division area R will be described below.

In addition, correction value calculator 40a calculates feedback correction value Vc by statistical processing whenever a predetermined number of positional deviation amounts ΔX and ΔY are collected for each division area R.

As the statistical processing, for example, an average value of a predetermined number of positional deviation amounts ΔX and ΔY except the outlier is calculated. The predetermined number is determined based on the allowable error or the like of feedback correction value Vc calculated by the statistical processing. In this manner, feedback correction value Vc with an appropriate accuracy can be calculated.

In addition, correction value calculator 40a calculates feedback correction value Vc by using positional deviation amounts ΔX and ΔY of one specific component D that is mounted at a rotation angle by mounting head 11 (component suction unit), among components D mounted on board 6. In a case where suction nozzle 11b of mounting head 11 is rotated in the θ direction to rotate component D sucked by suction nozzle 11b, in some cases, component center C is moved due to the distortion of an installation fixture of suction nozzle 11b or the distortion of suction nozzle 11b itself. In such a case, since positional deviation amounts ΔX and ΔY of component D with the same rotation angle are used, feedback correction value Vc can be accurately calculated by resolving the influence of the positional deviation generated by the rotation of suction nozzle 11b.

In addition, correction value calculator 40a calculates feedback correction value Vc for positional deviation amounts ΔX and ΔY of component D mounted on board 6 by predetermined component mounter 12 (the component mounting section). The meaning of calculating feedback correction value Vc for each component mounter 12 that mounts component D will be described below. Feedback correction value Vc calculated by correction value calculator 40a is stored as correction value data 41e in management storage 41.

Feedback correction value Vc calculated for each division area R and for each component mounter 12 is used for correcting the mounting operation for all components D mounted in division area R, performed by component mounter 12. Correction value transmission unit 40b associates feedback correction value Vc corresponding to component D mounted on board 6 with component D, and transmits feedback correction value Vc to component mounters M2 and M3 that mount corresponding component D. Transmitted feedback correction value Vc is stored as correction value data 21b in mounting storage 21 of component mounters M2 and M3. In this manner, the mounting positional deviation of component D can be accurately corrected.

Figure 10:
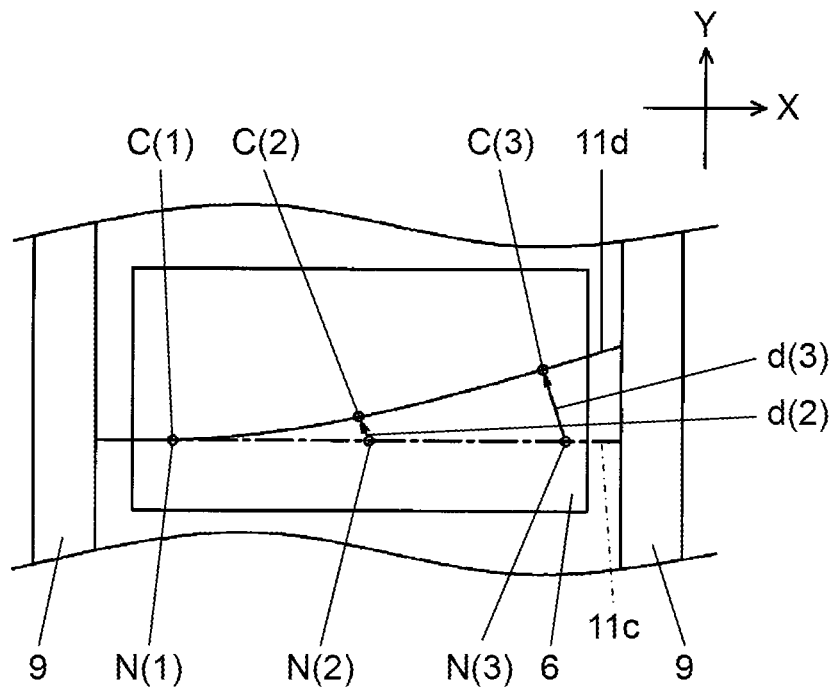
FIG. 10 is a diagram illustrating an influence of distortion of an X-axis beam of the component mounter, on a positional deviation amount, according to Exemplary Embodiment 1 of the disclosure.

Here, the meaning of calculating feedback correction value Vc for each component mounter 12 and for each division area R will be described with reference to FIG. 10. In Y-axis beam 9 and X-axis beam 10, deformation (thermal deformation) is generated over time due to the heat generated by the linear driving mechanism in the process of continuously performing the mounting operation. The degree of thermal deformation differs in each Y-axis beam 9 and each X-axis beam 10. FIG. 10 illustrates an example in which X-axis beam 10 is curved (deformed) inward (toward the upper side of the paper) from the normal position in component mounters M2 and M3 as X-axis beam 10 is closer to the right side of the drawing from the left side of the drawing, due to thermal deformation.

FIG. 10 illustrates trajectories of suction nozzle 11b of mounting head 11 that is moved on X-axis beam 10 in the X direction. Trajectory 11c illustrated by the dashed line indicates the position of suction nozzle 11b in a state where X-axis beam 10 is not thermally deformed. Trajectory 11d illustrated by the solid line indicates the position of suction nozzle 11b in a state where X-axis beam 10 is thermally deformed.

The mounting operation is controlled such that mounting head 11 mounts components D on board 6 at three positions of normal positions N(1), N(2), and N(3) by using suction nozzle 11b. In a case where X-axis beam 10 is not thermally deformed, normal positions N(1), N(2), and N(3) as the mounting positions are on trajectory 11c. However, due to the thermal deformation of X-axis beam 10, the positions of components D mounted on board 6 become component centers C(1), C(2), and C(3) on trajectory 11d.

In FIG. 10, since the thermal deformation of X-axis beam 10 is small at the position on the left side of the drawing, positional deviation amounts ΔX and ΔY of component center C(1) from normal position N(1) are small. Meanwhile, since the thermal deformation of X-axis beam 10 becomes larger toward the right side of the drawing, the position of component center C(2) is deviated from normal position N(2) by arrow d(2), and the position of component center C(3) is deviated from normal position N(3) by arrow d(3). That is, as the thermal deformation of X-axis beam 10 becomes larger, positional deviation amounts ΔX and ΔY become larger in order of component center C(1), component center C(2), and component center C(3).

In a state where positional deviation amounts ΔX and ΔY differ depending on the positions on board 6, when single feedback correction value Vc is calculated for the entirety of board 6 to correct the mounting operation, the positional deviation may not be appropriately corrected depending on the positions on board 6. Even in such a case, when board 6 is divided into a plurality of division areas R and feedback correction value Vc is calculated for each division area R to correct the mounting operation, the mounting positional deviation of component D due to the influence of changes in the device can be accurately corrected. In addition, since the influence of changes in the device differs in each component mounter 12, when feedback correction value Vc is calculated for each component mounter 12 to correct the mounting operation, the mounting positional deviation of component D due to the influence of changes in the device can be accurately corrected.

In FIG. 5, component selection unit 40c selects component D to be used for calculating feedback correction value Vc, based on any of the shape of component D and the size of component D, the rotation angle of component D, and the target mounting accuracy included in mounting data 41a and component information 41b. For example, for the selection of component D, component selection unit 40c excludes, from the selection target, component D(2) illustrated in FIG. 7 and component D(4) illustrated in FIGS. 8A and 8B, which have large variation in the mounting position when being mounted on board 6. In this manner, the mounting positional deviation of component D can be accurately corrected. Component selection unit 40c is a component selection section that selects component D to be used for calculating feedback correction value Vc, and correction value calculator 40a calculates feedback correction value Vc based on positional deviation amounts ΔX and ΔY of component D selected by the component selection section.

Figure 11A:
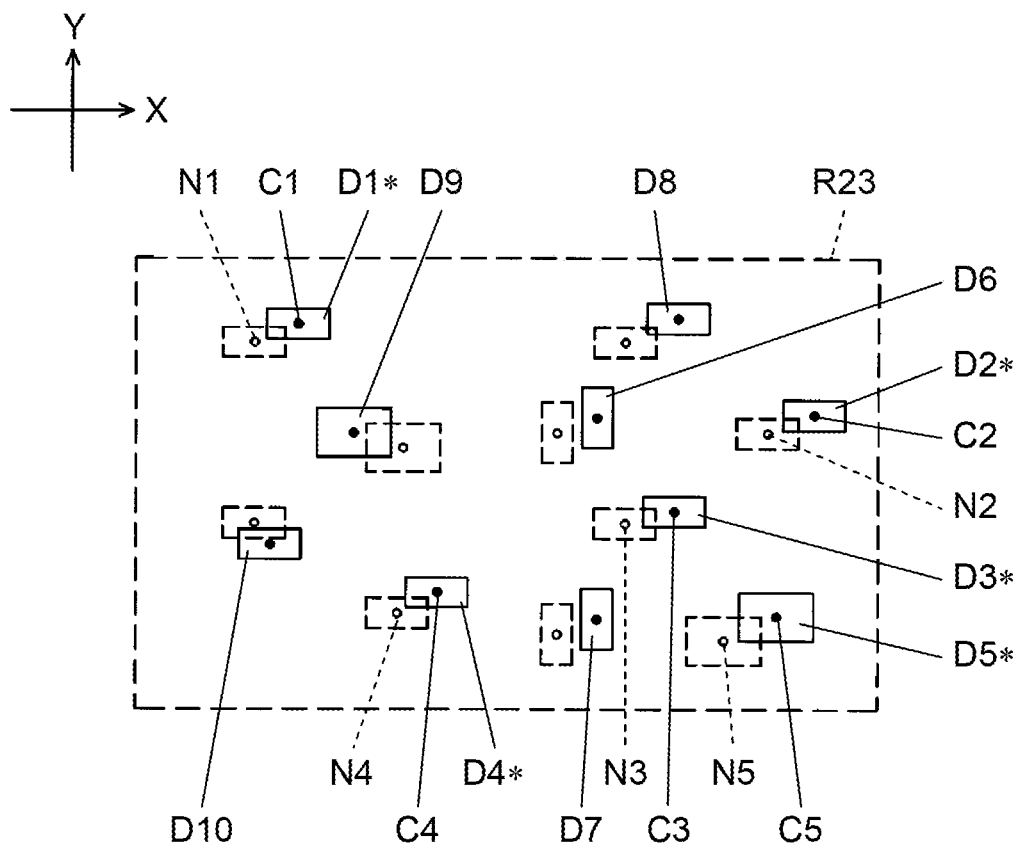
FIG. 11A is a diagram illustrating examples of components mounted in a division area imaged by the inspection device according to Exemplary Embodiment 1 of the disclosure.
Figure 11B:
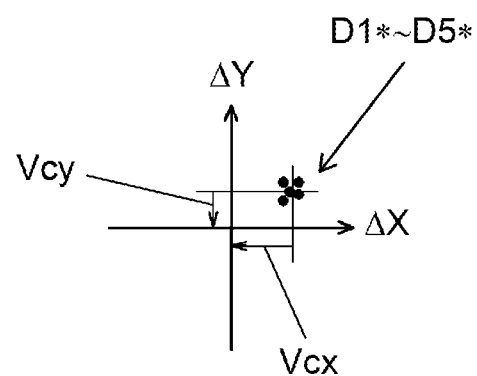
FIG. 11B is a diagram illustrating a relationship between examples of positional deviation amounts and a feedback correction value calculated by the inspection device according to Exemplary Embodiment 1 of the disclosure.

A specific example of calculating feedback correction value Vc by correction value calculator 40a will be described with reference to FIGS. 11A and 11B. FIG. 11A illustrates division area R23 provided on board 6. In division area R23, ten components D1* to D5* and D6 to D10 (illustrated by a solid line) mounted on board 6, component centers C1 to C10 (illustrated by a black circle, the reference numerals of component centers C6 to C10 are not illustrated) thereof, normal positions N1 to N10 (illustrated by white circle, the reference numerals of normal positions N6 to N10 are not illustrated) as the mounting targets, and the positions of components D (illustrated by a dashed line) of when components D are mounted at normal positions N.

Eight components D1* to D5* and D6 to D8 are mounted on board 6 by same component mounter 12 (for example, component mounter 12 on the front side of component mounter M2). Among these, components D6 and D7, of which the rotation angle when the component is mounted on board 6 is different from that of components D1* to D5*, are excluded from the calculation targets for feedback correction value Vc. Component D8 which has large mounting variation is excluded from the calculation targets for feedback correction value Vc by component selection unit 40c. Components D9 and D10 mounted on board 6 by component mounter 12 (for example, component mounter 12 of component mounter M3) that is different from component mounter 12 which mounts components D1* to D5* are also excluded from the calculation target for feedback correction value Vc.

That is, correction value calculator 40a calculates feedback correction value Vc based on positional deviation amounts ΔX and ΔY of components D1* to D5* which are mounted on board 6 at the same rotation angle by same component mounter 12, among a plurality of components D1* to D5* and D6 to D10 mounted in division area R23. FIG. 11B illustrates positional deviation amounts ΔX and ΔY of components D1* to D5* acquired by inspection device M4 by using an XY graph. Correction value calculator 40a performs statistical processing (here, calculates an average value) on positional deviation amounts ΔX and ΔY of components D1* to D5*, and calculates feedback correction value Vcx in the X direction and feedback correction value Vcy in the Y direction.

As described above, correction value calculator 40a is a correction value calculation section that calculates, feedback correction value Vc for correcting the mounting operation performed by the component mounting section, based on positional deviation amounts ΔX and ΔY of component D mounted in division area R, for each of a plurality of division areas R on board 6, based on positional deviation amounts ΔX and ΔY of component D mounted on board 6 by the component mounting section (component mounter 12), from normal position N.

In addition, management computer 3 including correction value calculator 40a is a correction value calculation device. The correction value calculation device is not limited to management computer 3 that is connected to component mounters M2 and M3, and inspection device M4 via communication network 2. The correction value calculation device is preferable as long as the correction value calculation device includes correction value calculator 40a, and the correction value calculation device may not be connected to component mounters M2 and M3, and inspection device M4.

Next, a component mounting method of correcting the mounting operation by using feedback correction value Vc that is calculated based on positional deviation amounts ΔX and ΔY of component D will be described in accordance with the flow of FIG. 12. First, component selection unit 40c (the component selection section) selects component D to be used for calculating feedback correction value Vc (ST1: component selection step). Next, mounting controller 20 corrects the mounting operation by using feedback correction value Vc of division area R in which component D is mounted, based on mounting data 21a and correction value data 21b, and mounts component D on board 6 (ST2: component mounting step). In this case, mounting controller 20 mounts component D on board 6 by rotating sucked component D by a predetermined angle in the rotation direction parallel with the mounting surface of board 6, based on mounting data 21a, as necessary.

Inspection camera 32 (capturer) images components D on board 6, on which components D are mounted by component mounters M2 and M3 and which is transported to inspection device M4 (ST3: imaging step). Next, positional deviation amount calculator 30a calculates positional deviation amounts ΔX and ΔY of component D from normal position N, based on the image imaged in the imaging step (ST3) (ST4: positional deviation amount calculation step). In this manner, the imaging step (ST3) and the positional deviation amount calculation step (ST4) become a positional deviation amount acquisition step (ST10) in which positional deviation amounts ΔX and ΔY of component D mounted on board 6 in the component mounting step (ST2) from normal position N are acquired.

Figure 12:
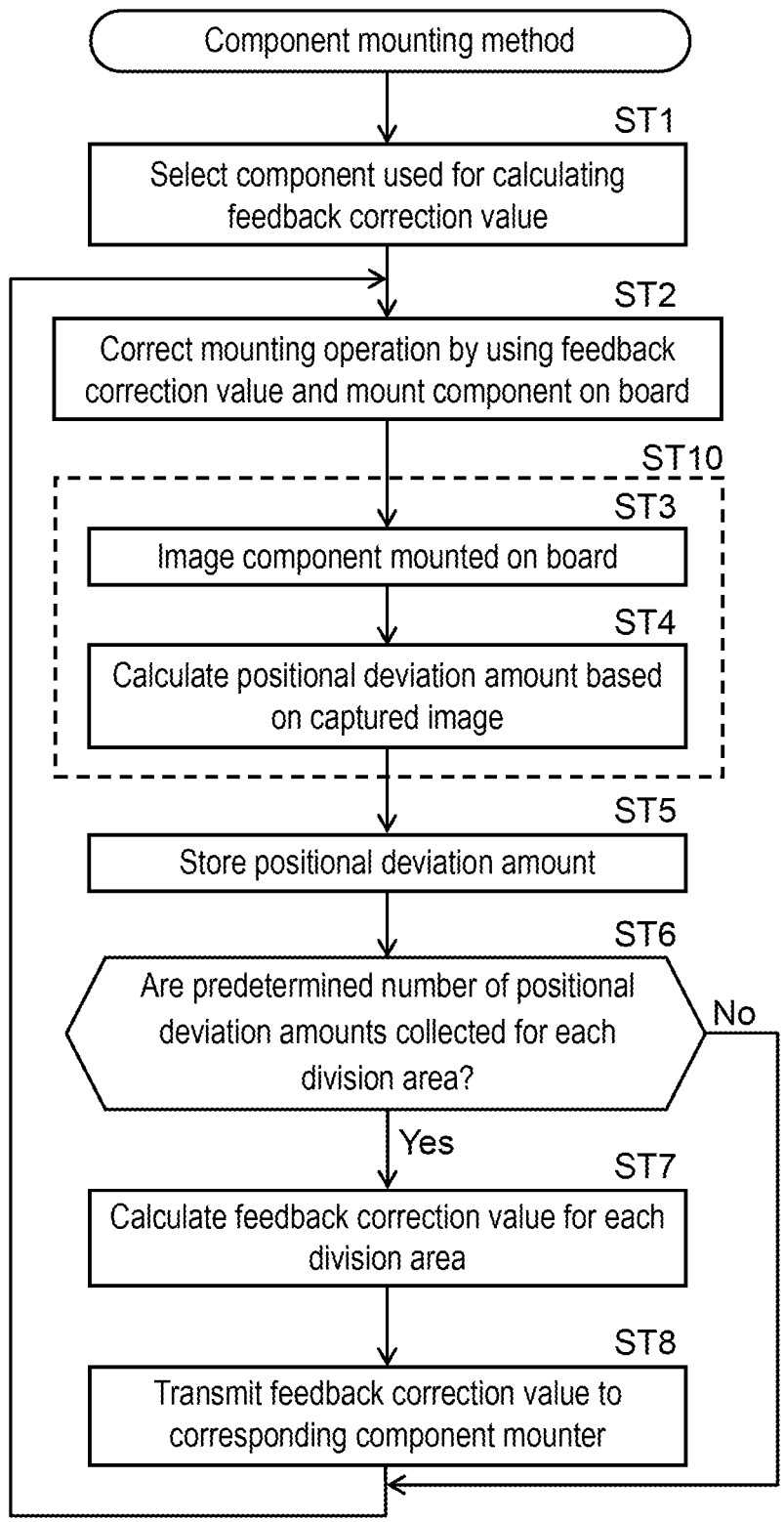
FIG. 12 is a flowchart illustrating a component mounting method in the component mounting system according to Exemplary Embodiment 1 of the disclosure.

In FIG. 12, management storage 41 continuously stores, during the manufacturing, positional deviation amounts ΔX and ΔY transmitted from inspection device M4 (the positional deviation amount acquisition section) (ST5: positional deviation amount storing step). Correction value calculator 40a determines whether a predetermined number of positional deviation amounts ΔX and ΔY are collected for each division area R and for each component mounter 12 (ST6: calculation propriety determination step).

In a case where a predetermined number of positional deviation amounts ΔX and ΔY are collected (Yes in ST6), correction value calculator 40a calculates, feedback correction value Vc feedback correction value Vc for correcting the mounting operation in the component mounting step (ST2), based on positional deviation amounts ΔX and ΔY of component D in division area R, for each of a plurality of division areas R on board 6 and for each component mounter 12 mounting component D, based on positional deviation amounts ΔX and ΔY acquired in the positional deviation amount acquisition step (ST10) (ST7: correction value calculation step). That is, in correction value calculation step (ST7), feedback correction value Vc is calculated whenever a predetermined number of positional deviation amounts ΔX and ΔY are collected for each division area R.

In the correction value calculation step (ST7), feedback correction value Vc is calculated by using positional deviation amounts ΔX and ΔY of one specific component D that is mounted at a rotation angle, among components D mounted on board 6. In addition, in the correction value calculation step (ST7), feedback correction value Vc is calculated based on positional deviation amounts ΔX and ΔY of component D selected in the component selection step (ST1).

In FIG. 12, correction value transmission unit 40b associates feedback correction value Vc corresponding to component D mounted on board 6 with component D, and transmits feedback correction value Vc to component mounters M2 and M3 that mount corresponding component D (ST8: correction value transmission step). When feedback correction value Vc is transmitted, the step returns to the component mounting step (ST2), component D is mounted on board 6 based on feedback correction value Vc which is newly transmitted and stored in correction value data 21b. In the calculation propriety determination step (ST6), in a case where it is determined that a predetermined number of positional deviation amounts ΔX and ΔY are not collected (No), the step returns to the component mounting step (ST2) without the calculation of feedback correction value Vc, and component D is mounted on board 6 based on correction value data 21b that is stored in advance.

In component mounting system 1, positional deviation amounts ΔX and ΔY are acquired during the manufacturing of the mounting board, and the mounting operation is corrected based on feedback correction value Vc calculated during the manufacturing. That is, during the manufacturing, inspection device M4 (the positional deviation amount acquisition section) acquires positional deviation amounts ΔX and ΔY in the positional deviation amount acquisition step (ST10), and during the manufacturing, correction value calculator 40a (correction value calculation section) calculates feedback correction value Vc in correction value calculation step (ST7).

As described above, component mounting system 1 according to Exemplary Embodiment 1 includes the component mounting section (component mounter 12) that mounts component D on board 6; the mounting control section (mounting controller 20) that controls the mounting operation performed by the component mounting section; the positional deviation amount acquisition section (inspection device M4) that acquires positional deviation amounts ΔX and ΔY of component D mounted on board 6; and the correction value calculation section (correction value calculator 40a) that calculates feedback correction value Vc for correcting the mounting operation, based on acquired positional deviation amounts ΔX and ΔY.

The correction value calculation section calculates feedback correction value Vc based on positional deviation amounts ΔX and ΔY of components D mounted in division area R, for each of a plurality of division areas R on board 6, and the mounting control section corrects the mounting operation performed by the component mounting section by using feedback correction value Vc of division area R in which component D is mounted. Accordingly, the mounting positional deviation of component D due to the influence of changes in the device such as thermal deformation can be accurately corrected.

Exemplary Embodiment 2

Hereinafter, Exemplary Embodiment 2 of the disclosure will be described with reference to the drawings. Exemplary Embodiment 2 is different from the component mounting system of Exemplary Embodiment 1 in that the mounting positional deviation of a component due to the influence of changes in a suction nozzle is corrected. The common reference numeral is given to the same configuration as that of Exemplary Embodiment 1, and the description thereof will not be repeated.

First, the related art for a component mounting system according to Exemplary Embodiment 2 will be described. In the related art, the mounting positional deviation is fed back for every component mounted on the board. However, the main cause in which the mounting positional deviation of the component occurs is the various changes of constituent elements of the component mounter such as deviation of an installation angle of a suction nozzle or distortion of a suction nozzle. Thus, there is room for improvement in order to improve a mounting accuracy.

Regarding such a related art, Exemplary Embodiment 2 discloses a component mounting system which corrects the mounting positional deviation of a component due to the influence of changes in a suction nozzle.

In FIG. 5, correction value calculator 40a calculates feedback correction value Vc for correcting the mounting operation performed by component mounter 12 (the component mounting section), based on positional deviation amount ΔX in the X direction and positional deviation amount ΔY in the Y direction (hereinafter, simply referred to as "positional deviation amounts ΔX and ΔY"), which are acquired by inspection device M4 (the positional deviation amount acquisition section) and are stored in the positional deviation amount data 41d, of component D mounted on board 6 from normal position N. Correction value calculator 40a calculates feedback correction value Vc for each suction nozzle 11b and for each predetermined rotation angle, based on positional deviation amounts ΔX and ΔY of component D mounted on board 6. The meaning of calculating feedback correction value Vc for each suction nozzle 11b and for each predetermined rotation angle will be described below.

In addition, correction value calculator 40a calculates feedback correction value Vc by statistical processing whenever a predetermined number of positional deviation amounts ΔX and ΔY are collected for each suction nozzle 11b and for each predetermined rotation angle. As the statistical processing, for example, an average value of a predetermined number of positional deviation amounts ΔX and ΔY except the outlier is calculated. The predetermined number is determined based on the allowable error or the like of feedback correction value Vc calculated by the statistical processing. In this manner, feedback correction value Vc with an appropriate accuracy can be calculated.

Feedback correction value Vc calculated for each suction nozzle 11b and for each predetermined rotation angle is used for correcting the mounting operation for components D mounted by component mounter 12. Correction value transmission unit 40b associates feedback correction value Vc corresponding to component D mounted on board 6 with component D, and transmits feedback correction value Vc to component mounters M2 and M3 that mount corresponding component D. Transmitted feedback correction value Vc is stored as correction value data 21b in mounting storage 21 of component mounters M2 and M3. In this manner, the mounting positional deviation of component D can be accurately corrected.

Figure 13:
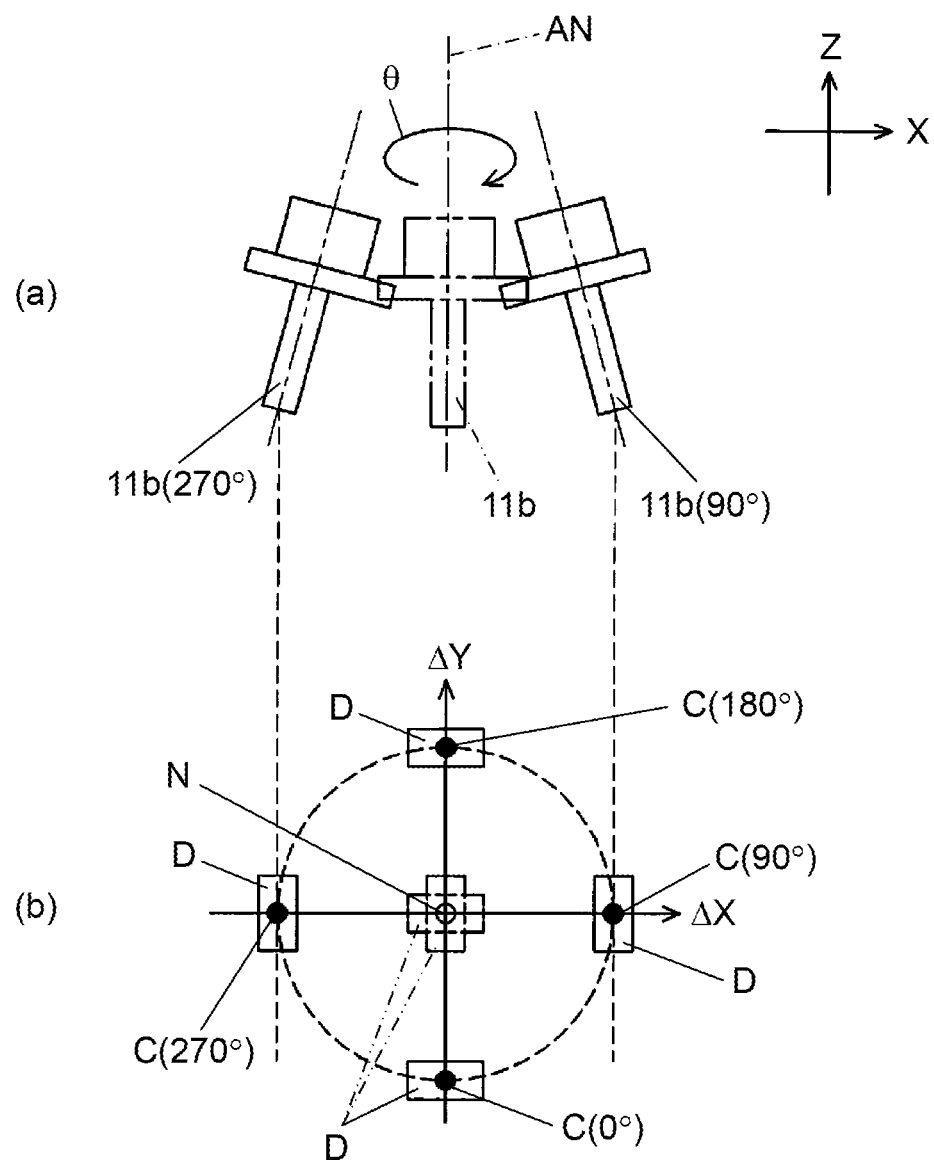
FIG. 13 is a diagram illustrating an influence of rotation of a suction nozzle of the component mounter, on a positional deviation of a component, according to Exemplary Embodiment 2 of the disclosure.

Here, the meaning of calculating feedback correction value Vc for each suction nozzle 11b and for each predetermined rotation angle will be described with reference to FIG. 13. As illustrated by the dashed line in (a) of FIG. 13, suction nozzle 11b is installed to mounting head 11 such that nozzle axis AN is in a vertical posture (the Z direction). However, in some cases, suction nozzle 11b is installed such that nozzle axis AN is inclined with respect to a vertical direction due to the distortion of an installation fixture of suction nozzle 11b or the distortion of suction nozzle 11b itself. The inclination of nozzle axis AN differs in each suction nozzle 11b.

In this manner, if the mounting operation is performed by suction nozzle 11b of which nozzle axis AN is inclined, component D is mounted on board 6 such that the position of component center C is deviated from normal position N. As illustrated in (b) of FIG. 13, when suction nozzle 11b is rotated, component D is mounted on board 6 such that the mounting position (component center C) of component D is moved according to the rotation angle. Thus, as illustrated in the example in (b) of FIG. 13, positional deviation amounts ΔX and ΔY differ for each rotation angle of 0°, 90°, 180°, and 270°.

In a state where positional deviation amounts ΔX and ΔY differ for each suction nozzle 11b and for each predetermined rotation angle, when single feedback correction value Vc is calculated for the entirety of board 6 to correct the mounting operation, the positional deviation may not be appropriately corrected due to suction nozzle 11b. Even in such a case, when feedback correction value Vc is calculated for each suction nozzle 11b and for each predetermined rotation angle to correct the mounting operation, the mounting positional deviation of component D due to the influence of the distortion of an installation fixture of suction nozzle 11b or the distortion of suction nozzle 11b itself can be accurately corrected.

Figure 14A:
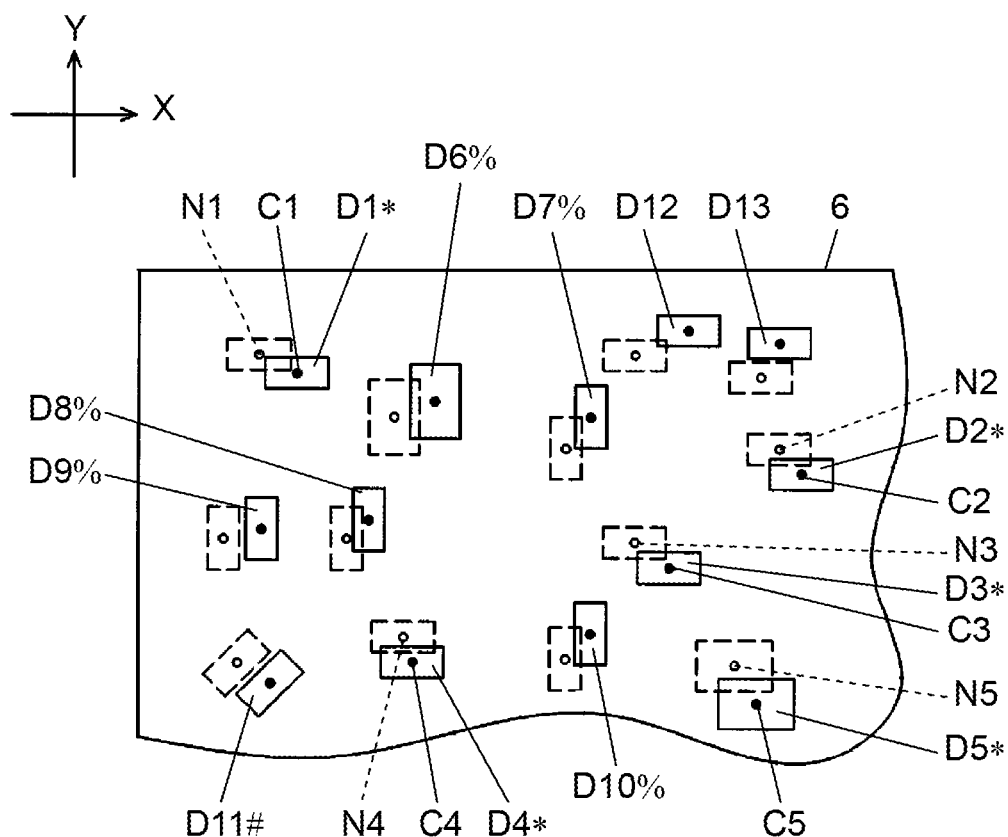
FIG. 14A is a diagram illustrating examples of components mounted on a board imaged by an inspection device according to Exemplary Embodiment 2 of the disclosure.

A specific example of calculating feedback correction value Vc by correction value calculator 40a will be described with reference to FIGS. 14A and 14B. FIG. 14A illustrates 13 components D1* to D5*, D6% to D10%, D11 #, D12, and D13 (illustrated by a solid line) mounted on board 6, component centers C1 to C13 (illustrated by a black circle, the reference numerals of component centers C6 to C13 are not illustrated) thereof, normal positions N1 to N13 (illustrated by white circle, the reference numerals of normal positions N6 to N13 are not illustrated) as the mounting targets, and the positions of components D (illustrated by a dashed line) of when components D are mounted at normal positions N.

12 components D1* to D5*, D6% to D10%, D11 #, and D12 are mounted on board 6 by same suction nozzle 11b. Components D1* to D5* are mounted on board 6 at a rotation angle of 0°, components D6% to D10% are mounted on board 6 at a rotation angle of 90°, and component D11 # is mounted on board 6 at a rotation angle of 45°. Among these, component D11 # having a rotation angle of 45° and component D12 which has large mounting variation are excluded from the calculation targets for feedback correction value Vc by component selection unit 40c. For component D13 mounted on board 6 by suction nozzle 11b that is different from suction nozzle 11b mounting components D1* to D5*, D6% to D10%, D11 #, and D12, feedback correction value Vc is calculated with other components D (not illustrated) that are mounted at the same rotation angle by same suction nozzle 11b.

That is, in this example, correction value calculator 40a respectively calculates feedback correction value Vc based on positional deviation amounts ΔX and ΔY of components D1* to D5* mounted on board 6 at the same rotation angle by same suction nozzle 11b, and feedback correction value Vc based on positional deviation amounts ΔX and ΔY of components D6% to D10% mounted on board 6 at the same rotation angle by same suction nozzle 11b. FIG. 14B illustrates positional deviation amounts ΔX and ΔY of components D1* to D5* and components D6% to D10% acquired by inspection device M4 by using an XY graph. Correction value calculator 40a performs statistical processing (here, calculates an average value) on positional deviation amounts ΔX and ΔY of components D1* to D5* and components D6% to D10%, and calculates feedback correction value Vcx (0°) and feedback correction value Vcx (90°) in the X direction, and feedback correction value Vcy (0°) and feedback correction value Vcy (90°) in the Y direction.

In addition, correction value calculator 40a calculates feedback correction value Vc (45°) of component D11 # that is mounted at a rotation angle of 45°, by interpolating feedback correction value Vc (90°) of components D6% to D10% having a rotation angle of 90° and feedback correction value Vc (0°) of components D1* to D5* having a rotation angle of 0°. That is, correction value calculator 40a calculates feedback correction value Vc (45°) of when component D11 # is mounted at a first rotation angle (45°) other than predetermined rotation angles (0° and 90°), by complementing feedback correction value Vc (90°) of a second rotation angle (90°) greater than the first rotation angle and feedback correction value Vc (0°) of a third rotation angle (0°) smaller than the first rotation angle.

Figure 14B:
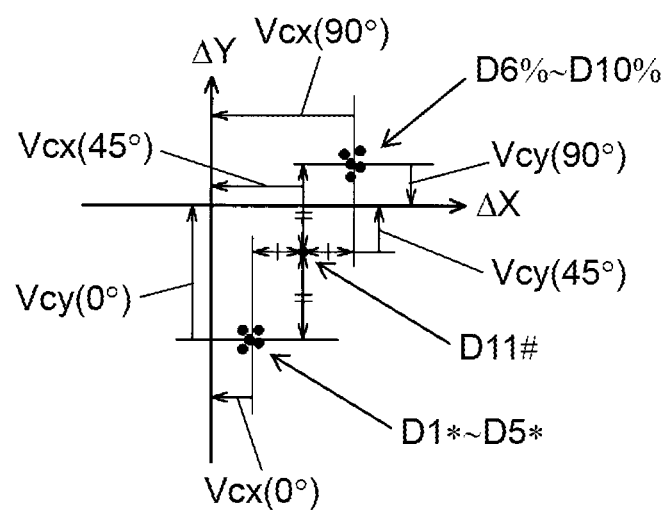
FIG. 14B is a diagram illustrating a relationship between examples of positional deviation amounts and a feedback correction value calculated by the inspection device according to Exemplary Embodiment 2 of the disclosure.

The complementing method is not limited to the linear interpolation of a linear function illustrated in FIG. 14B. A quadratic function or a cubic function may be used, or feedback correction value Vc (45°) may be calculated by interpolation using a circle including feedback correction value Vc (90°) of second rotation angle (90°) and feedback correction value Vc (0°) of third rotation angle (0°) as of which interpolating feedback correction value Vc (90°) and feedback the two points on the circumference. In this manner, even in a case where the number of components D11 # mounted at the first rotation angle (45°) is small, the mounting positional deviation of component D due to the influence of changes in suction nozzle 11b can be accurately corrected.

In a case where feedback correction value Vc of only one rotation angle (0° or 90°) is calculated, correction value calculator 40a calculates feedback correction value Vc (45°) of when component D11 # is mounted at the first rotation angle (45°) other than a predetermined rotation angle (0° or 90°), by using feedback correction value Vc (0°) or feedback correction value Vc (90°) of the predetermined rotation angle (0° or 90°) closest to the first rotation angle (45°).

As a method of calculating feedback correction value Vc (0°), feedback correction value Vc (0°) of the rotation angle (0°) or feedback correction value Vc (90°) of the rotation angle (90°) closest to the first rotation angle (45°) may be used as it is, or the calculation may be performed by the rotation by the difference of the rotation angle (45° or −45°). In this manner, even in a case where the number of components D11 # mounted at the first rotation angle (45°) is small, the mounting positional deviation of component D due to the influence of changes in suction nozzle 11b can be accurately corrected.

As described above, correction value calculator 40a is a correction value calculation section that calculates feedback correction value Vc for correcting the mounting operation performed by the component mounting section, for each suction nozzle 11b and for each predetermined rotation angle, based on positional deviation amounts ΔX and ΔY of components D mounted on board 6 by the component mounting section (component mounter 12) that mounts components D on board 6 by rotating components D in the rotation direction (the θ direction) parallel with the mounting surface of board 6 by using a plurality of suction nozzles 11b, from normal positions N.

In addition, management computer 3 including correction value calculator 40a is a correction value calculation device. The correction value calculation device is not limited to management computer 3 that is connected to component mounters M2 and M3, and inspection device M4 via communication network 2. The correction value calculation device is preferable as long as the correction value calculation device includes correction value calculator 40a, and the correction value calculation device may not be connected to component mounters M2 and M3, and inspection device M4.

Figure 15:
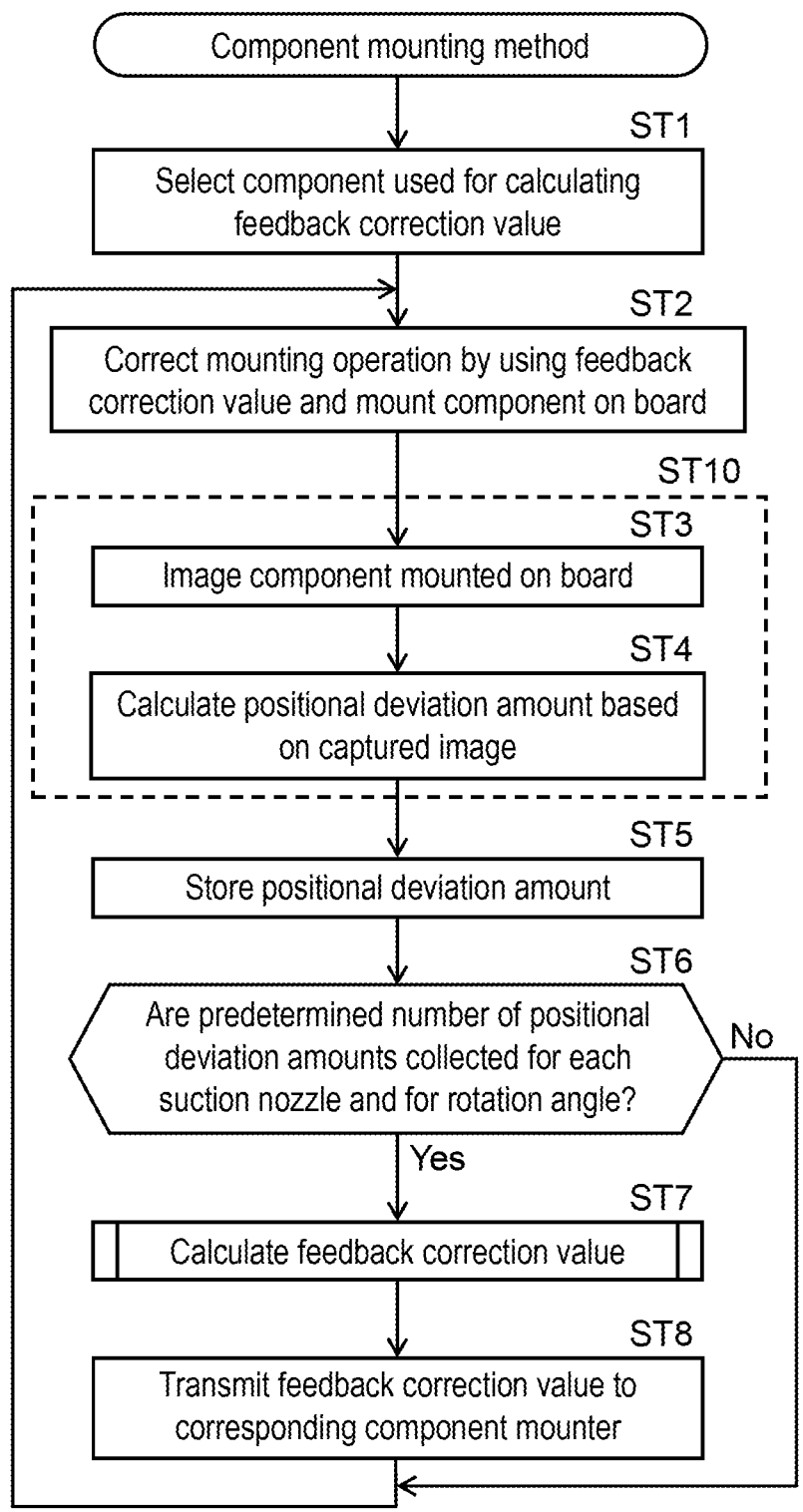
FIG. 15 is a flowchart illustrating a component mounting method in a component mounting system according to Exemplary Embodiment 2 of the disclosure.

Next, a component mounting method of correcting the mounting operation by using feedback correction value Vc that is calculated based on positional deviation amounts ΔX and ΔY of component D will be described in accordance with the flow of FIGS. 15 and 16. In FIG. 15, first, component selection unit 40c (the component selection section) selects component D to be used for calculating feedback correction value Vc (ST1: component selection step). Next, mounting controller 20 corrects the mounting operation by using feedback correction value Vc of a predetermined rotation angle of suction nozzle 11b that mounts component D, based on mounting data 21a and correction value data 21b, and mounts component D on board 6 by rotating component D in the rotation direction (the θ direction) parallel with the mounting surface of board 6 by using suction nozzle 11b (ST2: component mounting step).

Inspection camera 32 (capturer) images components D on board 6, on which components D are mounted by component mounters M2 and M3 and which is transported to inspection device M4 (ST3: imaging step). Next, positional deviation amount calculator 30a calculates positional deviation amounts ΔX and ΔY of component D from normal position N, based on the image imaged in the imaging step (ST3) (ST4: positional deviation amount calculation step). In this manner, the imaging step (ST3) and the positional deviation amount calculation step (ST4) become a positional deviation amount acquisition step (ST10) in which positional deviation amounts ΔX and ΔY of component D mounted on board 6 in the component mounting step (ST2) from normal position N are acquired.

In FIG. 15, management storage 41 continuously stores, during the manufacturing, positional deviation amounts ΔX and ΔY transmitted from inspection device M4 (the positional deviation amount acquisition section) (ST5: positional deviation amount storing step). Correction value calculator 40a determines whether a predetermined number of positional deviation amounts ΔX and ΔY are collected for each suction nozzle 11b and for each predetermined rotation angle (ST6: calculation propriety determination step).

In a case where a predetermined number of positional deviation amounts ΔX and ΔY are collected (Yes in ST6), correction value calculator 40a calculates feedback correction value Vc for correcting the mounting operation in the component mounting step (ST2), based on positional deviation amounts ΔX and ΔY acquired in the positional deviation amount acquisition step (ST10) (ST7: correction value calculation step). That is, in correction value calculation step (ST7), feedback correction value Vc is calculated whenever a predetermined number of positional deviation amounts ΔX and ΔY are collected for each suction nozzle 11b and for each predetermined rotation angle.

The details of correction value calculation step (ST7), that is, the method of calculating a feedback correction value will be described with reference to FIG. 16. First, correction value calculator 40a calculates feedback correction value Vc based on positional deviation amounts ΔX and ΔY of component D mounted on board 6, for each suction nozzle 11b and for each predetermined rotation angle (ST11). Next, correction value calculator 40a determines whether there is component D mounted on board 6 at a rotation angle other than the predetermined rotation angle of which feedback correction value Vc is calculated (ST12).

In a case where there is component D at a rotation angle other than the predetermined rotation angle (Yes in ST12), correction value calculator 40a determines whether there is feedback correction value Vc of a rotation angle that is smaller or greater than the rotation angle other than the predetermined rotation angle (ST13). In a case where there is feedback correction value Vc of a rotation angle that is smaller or greater than the rotation angle (Yes in ST13), correction value calculator 40a calculates feedback correction value Vc of when component D mounted at a first rotation angle other than the predetermined rotation angle is mounted, by interpolating feedback correction value Vc of a second rotation angle greater than the first rotation angle and feedback correction value Vc of a third rotation angle smaller than the first rotation angle (ST14: first calculation step).

Figure 16:
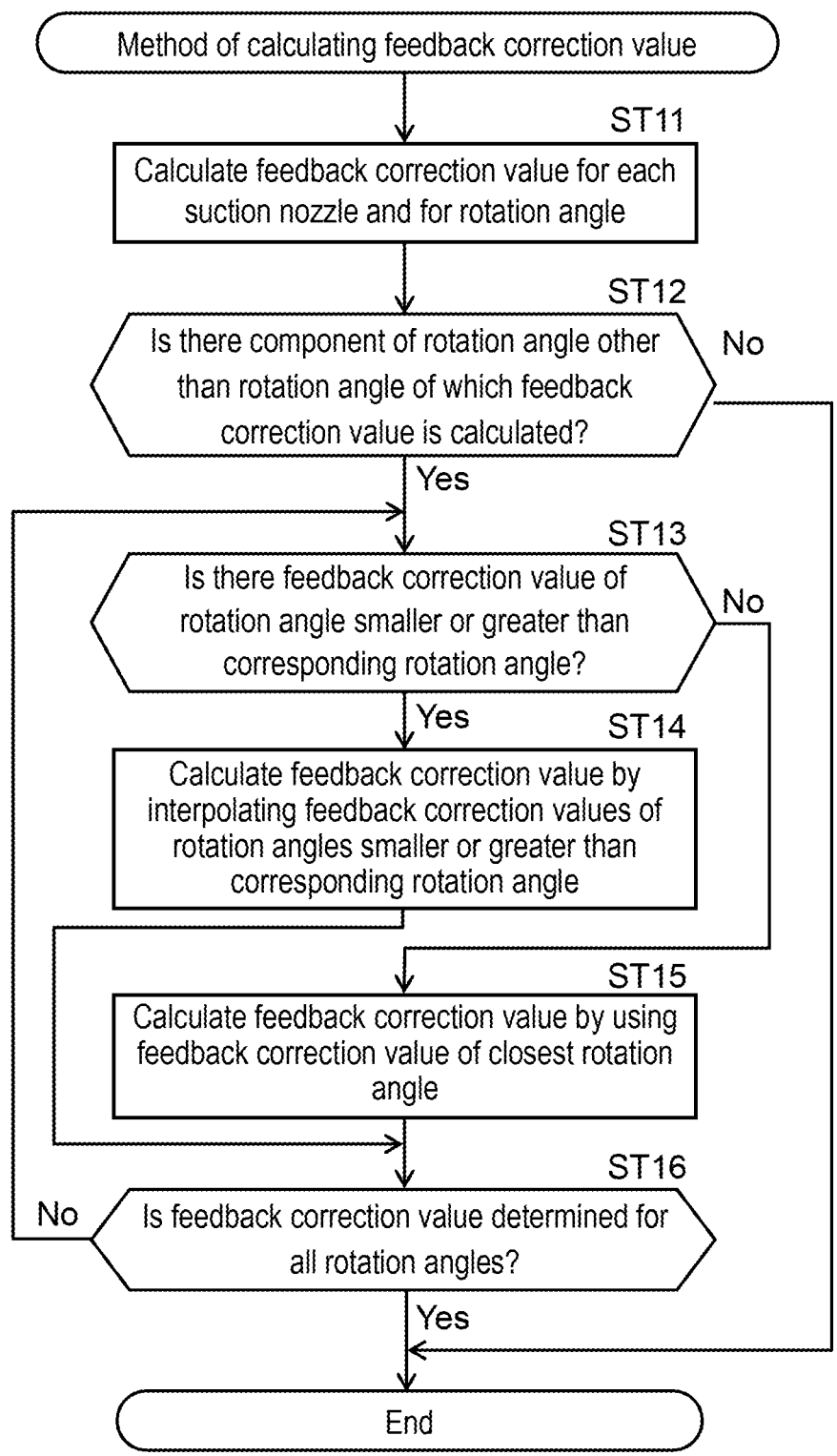
FIG. 16 is a flowchart illustrating a method of calculating a feedback correction value in a management computer according to Exemplary Embodiment 2 of the disclosure.

In FIG. 16, in a case where there is no feedback correction value Vc of a rotation angle that is smaller or greater than the rotation angle (No in ST13), correction value calculator 40a calculates feedback correction value Vc of when component D mounted at the first rotation angle other than the predetermined rotation angle is mounted, by using feedback correction value Vc of a predetermined rotation angle closest to the first rotation angle (ST15: second calculation step). In a case where feedback correction value Vc of the first rotation angle other than the predetermined rotation angle is calculated in the first calculation step (ST14) or the second calculation step (ST15), correction value calculator 40a determines whether feedback correction value Vc is calculated for all rotation angles (ST16).

In a case where feedback correction value Vc is not calculated for all rotation angles (No in ST16), the step returns to ST13, feedback correction value Vc of another rotation angle is calculated. In a case where feedback correction value Vc is calculated for all rotation angles (Yes in ST16), or in a case where there is no component D at a rotation angle other than the predetermined rotation angle (No in ST12), the calculation of feedback correction value Vc is finished.

In FIG. 15, correction value transmission unit 40b associates feedback correction value Vc corresponding to component D mounted on board 6 with component D, and transmits feedback correction value Vc to component mounters M2 and M3 that mount corresponding component D (ST8: correction value transmission step). When feedback correction value Vc is transmitted, the step returns to the component mounting step (ST2), component D is mounted on board 6 based on feedback correction value Vc which is newly transmitted and stored in correction value data 21b. In the calculation propriety determination step (ST6), in a case where it is determined that a predetermined number of positional deviation amounts ΔX and ΔY are not collected (No), the step returns to the component mounting step (ST2) without the calculation of feedback correction value Vc, and component D is mounted on board 6 based on correction value data 21b that is stored in advance.

In component mounting system 1, positional deviation amounts ΔX and ΔY are acquired during the manufacturing of the mounting board, and the mounting operation is corrected based on feedback correction value Vc calculated during the manufacturing. That is, during the manufacturing, inspection device M4 (the positional deviation amount acquisition section) acquires positional deviation amounts ΔX and ΔY in the positional deviation amount acquisition step (ST10), and during the manufacturing, correction value calculator 40a (correction value calculation section) calculates feedback correction value Vc in correction value calculation step (ST7).

As described above, component mounting system 1 according to Exemplary Embodiment 1 includes the component mounting section (component mounter 12) that mounts component D on board 6 by rotating component D in the rotation direction (the θ direction) parallel with the mounting surface by using suction nozzle 11b; the mounting control section (mounting controller 20) that controls the mounting operation performed by the component mounting section; the positional deviation amount acquisition section (inspection device M4) that acquires positional deviation amounts ΔX and ΔY of component D mounted on board 6; and the correction value calculation section (correction value calculator 40a) that calculates feedback correction value Vc for correcting the mounting operation, based on acquired positional deviation amounts ΔX and ΔY.

The correction value calculation section calculates feedback correction value Vc based on positional deviation amounts ΔX and ΔY of components D mounted on board 6, for each suction nozzle 11b and for each predetermined rotation angle, and the mounting control section corrects the mounting operation performed by the component mounting section by using feedback correction value Vc of a predetermined angle of suction nozzle 11b that mounts component D. Accordingly, the mounting positional deviation of component D due to the influence of changes in suction nozzle 11b can be accurately corrected.

In the component mounting system of Exemplary Embodiment 2, the positional deviation amount acquisition section includes a capturer that images a component; and a positional deviation amount calculator that calculates a positional deviation amount of the component from a normal position based on the image imaged by the capturer.

In addition, in the component mounting system of Exemplary Embodiment 2, the positional deviation amount acquisition section acquires the positional deviation amount during the manufacturing, and the correction value calculation section calculates the feedback correction value during the manufacturing.

In the component mounting system of Exemplary Embodiment 2, the correction value calculation section calculates a feedback correction value of when a component mounted at a first rotation angle other than a predetermined rotation angle is mounted, by using a feedback correction value of the predetermined rotation angle closest to the first rotation angle.

In the component mounting system of Exemplary Embodiment 2, the correction value calculation section calculates a feedback correction value of when a component mounted at a first rotation angle other than a predetermined rotation angle is mounted, by interpolating a feedback correction value of a second rotation angle greater than the first rotation angle and a feedback correction value of a third rotation angle smaller than the first rotation angle.

The component mounting system of Exemplary Embodiment 2 further includes the positional deviation amount storage that continuously stores the positional deviation amount during the manufacturing, and the correction value calculation section calculates the feedback correction value whenever a predetermined number of positional deviation amounts are collected for each suction nozzle and for each predetermined rotation angle.

The component mounting system of Exemplary Embodiment 2 further includes the component selection section that selects a component to be used for calculating a feedback correction value, and the correction value calculation section calculates a feedback correction value based on the positional deviation amount of the component selected by the component selection section.

The component mounting method of Exemplary Embodiment 2 includes the component mounting step that mounts a component on the board by rotating the component in the rotation direction parallel with the mounting surface of the board by using the suction nozzle; the positional deviation amount acquisition step that acquires the positional deviation amount of the component mounted on the board in the component mounting step, from the normal position; and the correction value calculation step that calculates the feedback correction value for correcting the mounting operation in the component mounting step, based on the positional deviation amount acquired in the positional deviation amount acquisition step. In the correction value calculation step, the feedback correction value is calculated based on the positional deviation amount of the component mounted on the board for each suction nozzle and for each predetermined rotation angle, and in the component mounting step, the mounting operation is corrected by using the feedback correction value of the predetermined rotation angle of the suction nozzle that mounts the component.

In addition, in the component mounting method of Exemplary Embodiment 2, the positional deviation amount acquisition step includes an imaging step of imaging a component; and a positional deviation amount calculation step of calculating a positional deviation amount of the component from the normal position based on the image imaged in the imaging step.

In the component mounting method of Exemplary Embodiment 2, during the manufacturing, the positional deviation amount is acquired in the positional deviation amount acquisition step, and during the manufacturing, the feedback correction value is calculated in the correction value calculation step.

In the component mounting method of Exemplary Embodiment 2, in the correction value calculation step, the feedback correction value of when the component mounted at the first rotation angle other than a predetermined rotation angle is mounted is calculated by using the feedback correction value of the predetermined rotation angle closest to the first rotation angle.

In the component mounting method of Exemplary Embodiment 2, in the correction value calculation step, the feedback correction value of when the component mounted at the first rotation angle other than a predetermined rotation angle is mounted is calculated by interpolating a feedback correction value of a second rotation angle greater than the first rotation angle and a feedback correction value of a third rotation angle smaller than the first rotation angle.

In addition, the component mounting method of Exemplary Embodiment 2 further includes the positional deviation amount storing step of continuously storing the positional deviation amount during the manufacturing, and in the correction value calculation step, the feedback correction value is calculated whenever a predetermined number of positional deviation amounts are collected for each suction nozzle and for each predetermined rotation angle.

The component mounting method of Exemplary Embodiment 2 further includes the component selection step of selecting a component to be used for calculating the feedback correction value, and in the correction value calculation step, the feedback correction value is calculated based on the positional deviation amount of the component selected in the component selection step.

The correction value calculation device of Exemplary Embodiment 2 includes the correction value calculator that calculates the feedback correction value for correcting the mounting operation performed by the component mounting section, for each suction nozzle and for each predetermined rotation angle, based on the positional deviation amount of the component mounted on the board by the component mounting section that mounts the component on the board by rotating the component in the rotation direction parallel with the mounting surface of the board by using a plurality of suction nozzles, from the normal position.

In the correction value calculation device of Exemplary Embodiment 2, the correction value calculator calculates the feedback correction value of when the component mounted at the first rotation angle other than the predetermined rotation angle is mounted, by using the feedback correction value of the predetermined rotation angle closest to the first rotation angle.

In the correction value calculation device of Exemplary Embodiment 2, the correction value calculator calculates the feedback correction value of when the component mounted at the first rotation angle other than the predetermined rotation angle is mounted, by interpolating the feedback correction value of the second rotation angle greater than the first rotation angle and the feedback correction value of the third rotation angle smaller than the first rotation angle.

In the correction value calculation device of Exemplary Embodiment 2, the correction value calculator calculates the feedback correction value whenever a predetermined number of positional deviation amounts are collected for each suction nozzle and for each predetermined rotation angle.

In the correction value calculation device of Exemplary Embodiment 2, the correction value calculator calculates the feedback correction value based on the positional deviation amount of the selected component.

In any embodiment described above, in component mounting system 1, the positional deviation amount acquisition section is not limited to inspection device M4. For example, the positional deviation amount acquisition section may be configured by component mounters M2 and M3 that include inspection camera 32 and positional deviation amount calculator 30a. In addition, the correction value calculation section is not limited to the correction value calculator 40a of management computer 3. For example, the correction value calculation section may be configured by causing component mounters M2 and M3 to include correction value calculator 40a.

The component mounting system, the component mounting method, and the correction value calculation device of the disclosure have an effect in which the mounting positional deviation of the component due to the influence of changes in the device can be accurately corrected, and are useful in the field of mounting a component on a board.

What is claimed is:

1. A component mounting system comprising:
    a component mounter that mounts components on a board;
    a mounting controller that controls a mounting operation of mounting the components on the board, the mounting operation being performed by the component mounter;
    a positional deviation amount acquisition unit that acquires a positional deviation amount of each of the components mounted on the board by the component mounter, from a corresponding normal position; and
    a correction value calculator that calculates a feedback correction value for correcting the mounting operation performed by the component mounter, based on the positional deviation amount acquired by the positional deviation amount acquisition unit,
    wherein the correction value calculator calculates the feedback correction value, based on the positional deviation amount of each of components mounted in each of a plurality of division areas on the board, for each of the plurality of division areas, and
    wherein the mounting controller corrects the mounting operation performed by the component mounter by using the feedback correction value of the plurality of division areas in which the components are mounted,
    wherein:
        the positional deviation amount acquisition unit is further configured to determine whether a predetermined number of positional deviation amounts for each division area have been collected; and the correction value calculator is further configured to, when the predetermined number of positional deviation amounts for each division area have been collected, obtain the feedback correction value by calculating an average value of the predetermined number of positional deviation amounts for each division area.

2. The component mounting system of claim 1, wherein the positional deviation amount acquisition unit includes a capturer that images the components, and a positional deviation amount calculator that calculates the positional deviation amount of each of the components from the corresponding normal position, based on an image imaged by the capturer.

3. The component mounting system of claim 1, wherein the positional deviation amount acquisition unit acquires the positional deviation amount during manufacturing, and wherein the correction value calculator calculates the feedback correction value during manufacturing.

4. The component mounting system of claim 1, wherein the component mounter includes a component suction unit that mounts each of the components by sucking each of the components and rotating each of the components by a predetermined angle in a rotation direction parallel with a mounting surface of the board, and wherein the correction value calculator calculates the feedback correction value by using a positional deviation amount of a component that is mounted at a specific rotational angle by the component suction unit, among the components mounted on the board.

5. The component mounting system of claim 1, further comprising:

a positional deviation amount storage that continuously stores the positional deviation amount during manufacturing, wherein the correction value calculator calculates the feedback correction value whenever a predetermined number of the positional deviation amounts are collected in the positional deviation amount storage for each of the plurality of division areas.

6. The component mounting system of claim 1, further comprising:

a component selection unit that selects a component to be used for calculating the feedback correction value, wherein the correction value calculator calculates the feedback correction value, based on a positional deviation amount of a component selected by the component selection unit.

7. A component mounting method comprising:

a component mounting step of mounting components on a board;

a positional deviation amount acquisition step of acquiring a positional deviation amount of each of the components mounted on the board in the component mounting step, from a corresponding normal position; and a correction value calculation step of calculating a feedback correction value for correcting a mounting operation in the component mounting step, based on the positional deviation amount acquired in the positional deviation amount acquisition step, wherein in the correction value calculation step, the feedback correction value is calculated based on the positional deviation amount of each of components mounted in each of a plurality of division areas on the board, for each of the plurality of division areas, and wherein in the component mounting step, the mounting operation is corrected by using the feedback correction value of the plurality of division areas in which the components are mounted, wherein:

the positional deviation amount acquisition step comprises determining whether a predetermined number of positional deviation amounts for each division area have been collected; and the correction value calculation step comprises, when the predetermined number of positional deviation amounts for each division area have been collected, obtaining the feedback correction value by calculating an average value of the predetermined number of positional deviation amounts for each division area.

8. The component mounting method of claim 7, wherein the positional deviation amount acquisition step includes an imaging step of imaging the components; and a positional deviation amount calculation step of calculating the positional deviation amount of each of the components from the corresponding normal position, based on an image imaged in the imaging step.

9. The component mounting method of claim 7, wherein during manufacturing, the positional deviation amount is acquired in the positional deviation amount acquisition step, and during manufacturing, the feedback correction value is calculated in the correction value calculation step.

10. The component mounting method of claim 7, wherein in the component mounting step, each of sucked components is mounted by being rotated by a predetermined angle in a rotation direction parallel with a mounting surface of the board, and wherein in the correction value calculation step, the feedback correction value is calculated by using a positional deviation amount of a component that is mounted at a specific rotational angle, among the components mounted on the board.

11. The component mounting method of claim 7, further comprising:

a positional deviation amount storing step of continuously storing the positional deviation amount during manufacturing, wherein in the correction value calculation step, the feedback correction value is calculated whenever a predetermined number of the positional deviation amounts are collected in the positional deviation amount storing step for each of the plurality of division areas.

12. The component mounting method of claim 7, further comprising:

a component selection step of selecting a components to be used for calculating the feedback correction value, wherein in the correction value calculation step, the feedback correction value is calculated, based on a positional deviation amount of a component selected in the component selection step.

13. A component mounting method comprising:

a component mounting step of mounting components on a board;

a positional deviation amount acquisition step of acquiring a positional deviation amount of each of the components mounted on the board in the component mounting step, from a corresponding normal position; and a correction value calculation step of calculating a feedback correction value for correcting a mounting operation in the component mounting step, based on the positional deviation amount acquired in the positional deviation amount acquisition step, wherein in the correction value calculation step, the feedback correction value is calculated based on the positional deviation amount of each of components mounted in each of a plurality of division areas on the board, for each of the plurality of division areas, and wherein in the component mounting step, the mounting operation is corrected by using the feedback correction value of the plurality of division areas in which the components are mounted, wherein:
 the positional deviation amount acquisition step comprises obtaining two feedback values for components mounted at two different angles; and
 the correction value calculation step comprises calculating a feedback correction value for a component to be mounted at an angle between the two different angles by interpolating the two feedback values.

* * * * *